United States Patent
Yang et al.

(10) Patent No.: US 12,446,267 B2
(45) Date of Patent: Oct. 14, 2025

(54) SEMICONDUCTOR DEVICE

(71) Applicant: Samsung Electronics Co., Ltd., Suwon-si (KR)

(72) Inventors: Se Min Yang, Seoul (KR); Byung Jae Kang, Suwon-si (KR); Jong Keum Lee, Hwaseong-si (KR); Hee Sung Lee, Pyeongtaek-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 497 days.

(21) Appl. No.: 17/828,329

(22) Filed: May 31, 2022

(65) Prior Publication Data

US 2023/0085469 A1 Mar. 16, 2023

(30) Foreign Application Priority Data

Sep. 14, 2021 (KR) ........................ 10-2021-0122159

(51) Int. Cl.
*H10D 30/69* (2025.01)
*H10B 12/00* (2023.01)
*H10D 62/13* (2025.01)
*H10D 84/01* (2025.01)

(52) U.S. Cl.
CPC ........... *H10D 30/796* (2025.01); *H10B 12/50* (2023.02); *H10D 62/151* (2025.01)

(58) Field of Classification Search
CPC ............. H01L 29/7847; H01L 29/0847; H01L 29/78642; H01L 29/66439; H01L 29/41766; H01L 29/0673; H01L 29/775; H01L 29/7833; H01L 21/26506; H01L 29/32; H10B 12/50; H10B 12/30; H10B 12/31; H10B 12/34; B82Y 10/00

See application file for complete search history.

(56) References Cited

U.S. PATENT DOCUMENTS

| | | | |
|---|---|---|---|
| 5,514,902 A | 5/1996 | Kawasaki et al. | |
| 6,198,141 B1 | 3/2001 | Yamazaki et al. | |
| 7,015,108 B2 | 3/2006 | Vanderpool et al. | |
| 7,601,996 B2 | 10/2009 | Ohta et al. | |
| 8,304,819 B2 * | 11/2012 | Jung | H01L 29/458 257/288 |
| 10,068,802 B2 | 9/2018 | Eshun et al. | |
| 2007/0284615 A1 * | 12/2007 | Ku | H01L 21/26513 257/E21.336 |

(Continued)

FOREIGN PATENT DOCUMENTS

| | | |
|---|---|---|
| JP | H10125916 A | 5/1998 |
| KR | 20010087474 A | 9/2001 |

(Continued)

*Primary Examiner* — David Vu
(74) *Attorney, Agent, or Firm* — Wolf, Greenfield & Sacks, P.C.

(57) ABSTRACT

A semiconductor device is provided. The semiconductor device includes a substrate, device isolation films defining an active region in the substrate, the active region defined in the substrate by the device isolation films, a gate pattern formed in the active region, and source/drain regions on both sides of the gate pattern, in the active region, the source/drain regions include first parts, which are doped with carbon monoxide (CO) ions and are recrystallized.

20 Claims, 22 Drawing Sheets

(56) References Cited

U.S. PATENT DOCUMENTS

| | | | | |
|---|---|---|---|---|
| 2010/0144110 | A1* | 6/2010 | Wang | H01L 21/26513 |
| | | | | 257/E21.334 |
| 2018/0096885 | A1* | 4/2018 | Chan | H01L 21/28518 |
| 2019/0273143 | A1* | 9/2019 | Leobandung | H10D 30/6729 |
| 2019/0393351 | A1* | 12/2019 | Beattie | H01L 29/78684 |

FOREIGN PATENT DOCUMENTS

| | | |
|---|---|---|
| KR | 10-2011-0040470 A | 4/2011 |
| KR | 20130140085 A | 12/2013 |

\* cited by examiner

SEMICONDUCTOR DEVICE

CROSS-REFERENCE TO RELATED APPLICATION

This application claims priority to Korean Patent Application No. 10-2021-0122159, filed on Sep. 14, 2021, and all the benefits accruing therefrom under 35 U.S.C. § 119, the disclosure of which is incorporated herein by reference in its entirety.

BACKGROUND

1. Field

The present disclosure relates to semiconductor devices.

2. Description of the Related Art

As information media has rapidly spread, the functions of semiconductor devices have been rapidly developed. Low production cost and high integration are required of recent semiconductor products to secure competitiveness and high quality.

As semiconductor products have been highly integrated, research is underway on ways to lower the resistance of the source/drain contacts of transistors. The resistance of a source/drain contact may be determined by how much the height of a Schottky barrier can be lowered, and methods of lowering the height of a Schottky barrier using doping are used to lower the resistance of a source/drain contact.

SUMMARY

Example embodiments of the present disclosure provide semiconductor devices with an improved product performance.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to some example embodiments of the present disclosure, there is provided a semiconductor device including a substrate, device isolation films defining an active region in the substrate, a gate pattern in the active region, and source/drain regions on both sides of the gate pattern, in the active region, wherein the source/drain regions include first parts, which are doped with carbon monoxide (CO) ions and are recrystallized.

According to the aforementioned and some example embodiments of the present disclosure, there is provided a semiconductor device including a substrate including a cell region and a peripheral region, which is defined around the cell region, a bitline structure including a cell conductive line and a cell line capping film, which is on the cell conductive line, on the substrate, a cell gate electrode in the substrate in the cell region, the cell gate electrode intersecting the cell conductive line, a peripheral gate pattern on an active region of the peripheral region, and source/drain regions on both sides of the gate pattern, in the active region of the peripheral region, wherein the source/drain regions include first parts, which are doped with carbon monoxide (CO) ions and are recrystallized.

According to the aforementioned and some example embodiments of the present disclosure, there is provided a semiconductor device including an active pattern extending in a first direction on a substrate, gate structures including gate electrodes, which extend in a second direction different from the first direction, on the active pattern, and source/drain regions between the gate electrodes, on the active pattern, wherein the source/drain regions include first parts, which are doped with carbon monoxide (CO) ions and are recrystallized.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail embodiments thereof with reference to the attached drawings, in which.

DETAILED DESCRIPTION

Embodiments of the present disclosure will hereinafter be described with reference to the accompanying drawings.

Figure 1:
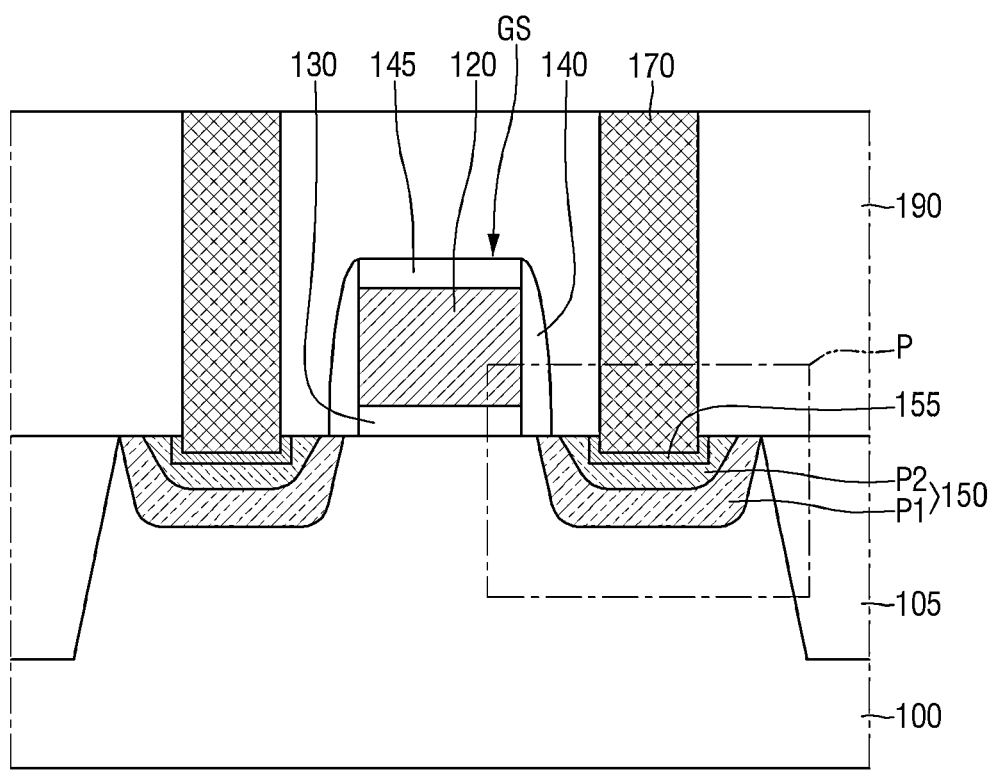
FIG. 1 is a cross-sectional view of a semiconductor device according to some example embodiments of the present disclosure.
Figure 2:
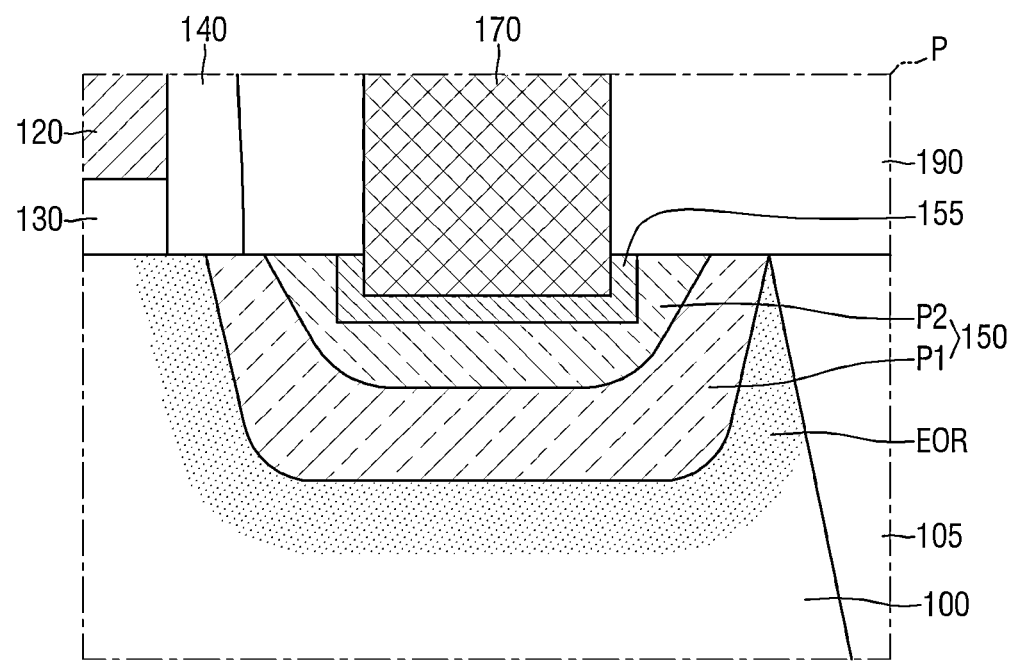
FIG. 2 is an enlarged cross-sectional view of part P of FIG. 1.

FIG. 1 is a cross-sectional view of a semiconductor device according to some example embodiments of the present disclosure. FIG. 2 is an enlarged cross-sectional view of part P of FIG. 1.

Referring to FIGS. 1 and 2, the semiconductor device according to some example embodiments of the present disclosure may include a substrate 100, first device isolation films 105, a gate structure GS, first source/drain regions 150, silicide films 155, first source/drain contacts 170, and a first interlayer insulating film 190.

The semiconductor device according to some example embodiments of the present disclosure may be a P-type metal-oxide semiconductor (PMOS).

The substrate 100 may be a silicon (Si) substrate or a silicon-on-insulator (SOI) substrate. Alternatively, the substrate 100 may include silicon-germanium (SiGe), SiGe-on-insulator (SGOI), indium antimonide, a lead tellurium compound, indium arsenide, indium phosphide, gallium arsenide, and/or gallium antimonide, but the present disclosure is not limited thereto.

The first device isolation films 105 may be disposed in the substrate 100. The first device isolation films 105 may define an active region. The first device isolation films 105 may be formed in a shallow trench isolation (STI) structure. The first device isolation films 105 may extend from the top surface of the substrate 100 in the thickness direction of the substrate 100. The thickness direction of the substrate 100 may be orthogonal to the top surface of the substrate 100. The first device isolation films 105 may include at least one of, for example, silicon oxide, silicon nitride, silicon oxynitride, and a combination thereof.

The gate structure GS may include a first gate electrode, a first gate insulating film 130, first gate spacers 140, and a first gate capping pattern 145.

The first gate insulating film 130 may be disposed on the substrate 100.

The first gate insulating film 130 may include silicon oxide, silicon oxynitride, silicon nitride, and/or a high-k material having a greater dielectric constant than silicon oxide. The high-k material may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate electrode 120 may be formed on the first gate insulating film 130.

The first gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), Tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof.

The first gate electrode 120 may include a conductive metal oxide, a conductive metal oxynitride, and/or an oxidized form of any one of the above-described materials.

The first gate spacers 140 may be disposed on the sidewalls of the first gate electrode 120. The first gate spacers 140 may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), and a combination thereof.

The first gate capping pattern 145 may be disposed on the top surface of the first gate electrode 120 and the top surfaces of the first gate spacers 140. The first gate capping pattern 145 may include at least one of, for example, SiN, SiON, SiO$_2$, silicon carbonitride (SiCN), SiOCN, and a combination thereof.

Although not specifically illustrated, the first gate capping pattern 145 may be disposed between the first gate spacers 140. In this case, the top surface of the first gate capping pattern 145 may be placed on the same plane as the top surfaces of the first gate spacers 140. The top surface of the first gate capping pattern 145 may correspond to the top surface of the gate structure GS.

FIG. 1 illustrates that one gate structure GS is disposed between the first device isolation films 105, but the present disclosure is not limited thereto.

The first source/drain regions 150 may be formed in the substrate 100. For example, the first source/drain regions 150 may include SiGe. In another example, the first source/drain regions 150 may include Si.

The first source/drain regions 150 may include doped impurities. In some example embodiments, the first source/drain regions 150 may be doped with boron (B).

The impurities that the first source/drain regions 150 are doped with may diffuse deeper than a target depth due to transient enhanced diffusion (TED). To prevent or reduce the TED of impurities, a pre-amorphization implantation (PAI) process may be performed before the doping of the impurities.

Also, in a case where impurities are doped into the first source/drain regions 150, PAI may be performed to reduce the channeling of the doped impurities.

For example, in a case where PAI is performed, carbon (C) ions may be implanted into the first source/drain regions 150. As a result, the first source/drain regions 150 may be amorphized, and the channeling of doped impurities may be reduced later.

In some example embodiments, before the doping of the first source/drain regions 150 with B, carbon monoxide (CO) ions may be implanted so that the first source/drain regions 150 may be amorphized. As CO ions have a larger molecular weight than C ions, the amorphization of the first source/drain regions 150 may be further enhanced. That is, the first source/drain regions 150 may be further amorphized when doped with CO ions than when doped with C ions.

The first source/drain regions 150 may be connected to the first source/drain contacts 170. That is, as the first source/drain contacts 170 are formed on the first source/drain regions 150, the first source/drain regions 150 and the first source/drain contacts 170 may be electrically connected. In a case where the first source/drain contacts 170 are formed on the first source/drain regions 150, the first source/drain regions 150 may be doped with impurities to reduce the resistance between the first source/drain regions 150 and the first source/drain contacts 170. In some example embodiments, the sheet resistance between the first source/ drain regions 150 and the first source/drain contacts 170 may be reduced by doping the first source/drain regions 150 with B.

The diffusion of impurities, the implantation depth of PAI ions, which are ions injected for PAI, or the implantation depth of impurities may be controlled by implantation energy. For example, the implantation depth of PAI ions may be set to be greater than the implantation depth of impurities by making energy for injecting the PAI ions greater than energy for injecting the impurities.

As the first source/drain regions 150 are amorphized by implanting ions into the first source/drain regions 150, amorphous-crystalline interfaces may be formed between amorphous parts and crystalline parts of the first source/drain regions 150. Specifically, end-of-range (EOR) regions "EOR" may be formed between the amorphous parts and the crystalline parts of the first source/drain regions 150. In some example embodiments, the EOR regions "EOR" may include point defects.

Lattice defects in the EOR regions "EOR" and impurities doped into the first source/drain regions 150 may be recombined. Specifically, as the impurities doped into the first source/drain regions 150 diffuse into the EOR regions "EOR", the doped impurities may be positioned in the EOR regions "EOR", but not in the first source/drain regions 150.

To prevent or reduce the impurities doped into the first source/drain regions 150 into the EOR regions "EOR", PAI ions may be injected between parts of the first source/drain regions 150 that are doped with the impurities and the EOR regions "EOR". Specifically, PAI ions may be injected to be positioned between the parts of the first source/drain regions 150 that are doped with the impurities and the EOR regions "EOR" other than the first source/drain regions 150. The PAI ions may be injected closer than the impurities doped into the first source/drain regions 150 to the EOR regions "EOR". In some example embodiments, the dose of the PAI ions injected into the first source/drain regions 150 may be $1E^{14}/cm^2$.

The first source/drain contacts 170 may be formed on the first source/drain regions 150. Specifically, the first source/drain contacts 170 may be formed on second parts P2 of the first source/drain regions 150.

The silicide films 155 may be formed below the first source/drain contacts 170. The silicide films 155 may be formed between the first source/drain contacts 170 and the first source/drain regions 150. The silicide films 155 may be formed along the profiles of the interfaces between the first source/drain regions 150 and the first source/drain contacts 170, but the present disclosure is not limited thereto. The silicide films 155 may include, for example, a metal silicide material.

Specifically, the silicide films 155 may be formed between the second parts P2 of the first source/drain regions 150 and the first source/drain contacts 170. The silicide films 155 may reduce the resistance between the first source/drain contacts 170 and the first source/drain regions 150.

The first interlayer insulating film 190 may be disposed on the substrate 100, the gate structure GS, and the first source/drain regions 150. The first interlayer insulating film 190 may be disposed on the first gate capping pattern 145. The first interlayer insulating film 190 may be disposed on side surfaces of the first gate spacers 140. The first interlayer insulating film 190 may surround the first source/drain contacts 170.

The first interlayer insulating film 190 may include at least one of, for example, silicon oxide, silicon nitride, silicon oxynitride, and a low-k material. The low-k material may include, for example, fluorinated tetraethyl orthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazane (TOSZ), fluoride silicate glass (FSG), polyimide nanofoams (e.g., polypropylene oxide) carbon doped silicon oxide (CDO), organo silicate glass (OSG), SiLK, amorphous fluorinated carbon, silica aerogels, silica xerogels, mesoporous silica, and a combination thereof, but the present disclosure is not limited thereto.

Referring to FIG. 2, a first part P1 may prevent or reduce impurities doped into a second part P2 from diffusing into an EOR region "EOR" beyond a first source/drain region 150 and may include a region into which PAI ions are injected to amorphize the first source/drain region 150. Specifically, the first part P1 may include a region that has the PAI ions injected thereinto and is recrystallized.

The second part P2 may include a region that is doped with impurities to reduce the resistance between the first source/drain region 150 and a first source/drain contact 170.

The EOR region "EOR" may include a region where lattice defects have occurred due to the impurities and the ions doped or implanted into the first source/drain region 150. As the first part P1 is positioned between the second part P2 and the EOR region "EOR", the first part P1 may prevent or reduce the impurities doped into the second part P2 from diffusing into the EOR region "EOR".

The thickness of the EOR region "EOR" may be less than the thickness of the first source/drain region 150. In some example embodiments, as CO is implanted into the first source/drain region 150, the thickness of the EOR region "EOR" may be less than the thickness of the first part P1.

Figure 3:
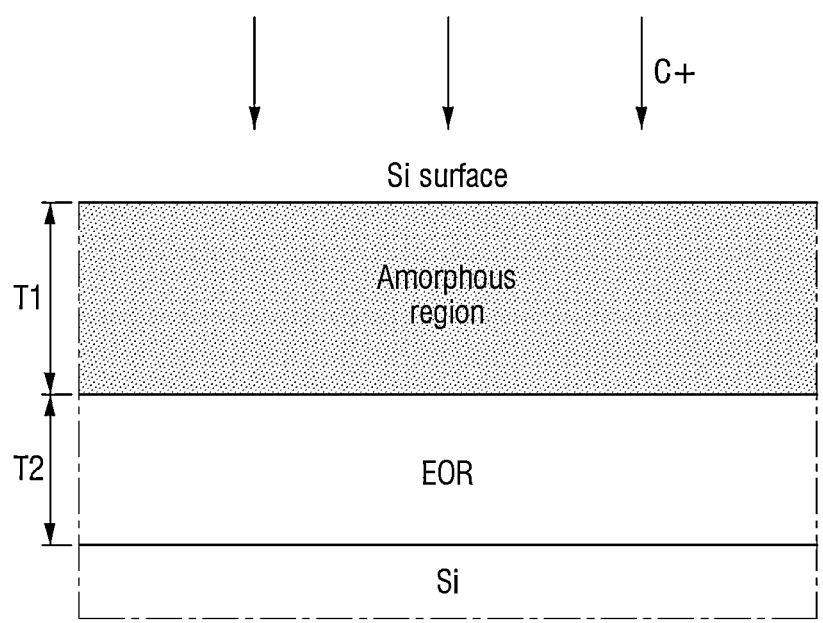
FIG. 3 is a cross-sectional view of a semiconductor device according to some example embodiments of the present disclosure.
Figure 4:
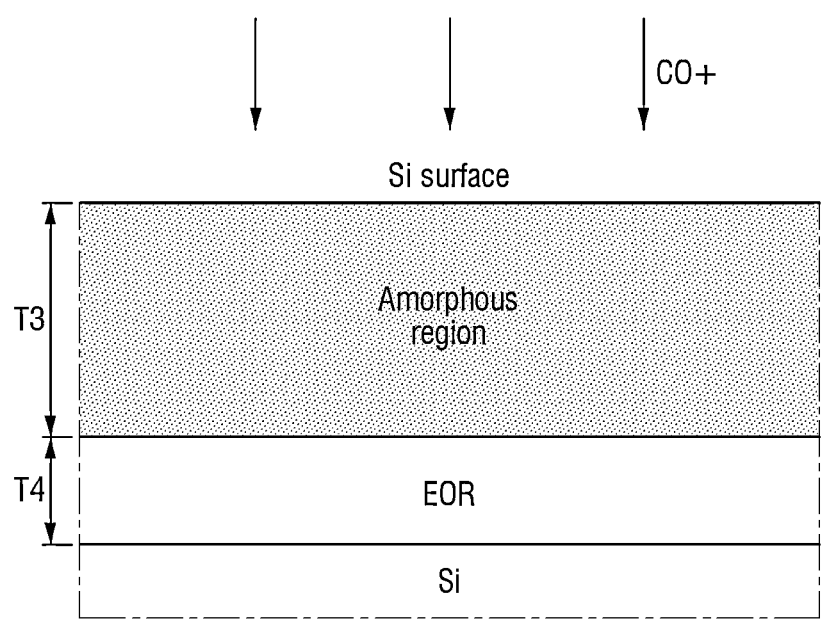
FIG. 4 is a cross-sectional view of a semiconductor device according to some example embodiments of the present disclosure.

FIG. 3 is a cross-sectional view of a semiconductor device according to some example embodiments of the present disclosure. FIG. 4 is a cross-sectional view of a semiconductor device according to some example embodiments of the present disclosure.

Referring to FIGS. 3 and 4, the thicknesses of a region to be amorphized and an EOR region "EOR" may vary depending on the type of ions implanted for amorphization. Specifically, the thicknesses of the region to be amorphized and the EOR region "EOR" may vary depending on the molecular weight of the ions implanted for amorphization. For example, in a case where C ions are implanted, the region to be amorphized and the EOR region "EOR" may have first and second thicknesses T1 and T2, respectively. For example, in a case where CO ions are implanted, the region to be amorphized and the EOR region "EOR" may have third and fourth thicknesses T3 and T4, respectively. The sum of the first and second thicknesses T1 and T2 may be the same as the sum of the third and fourth thicknesses T3 and T4. The third thickness T3 may be greater than the first thickness T1. The second thickness T2 may be less than the first thickness T1.

The region to be amorphized can better prevent or reduce the diffusion of impurities doped thereon into the EOR region EOR when having the third thickness T3 than when having the first thickness T1.

FIG. 3 illustrates the implantation of C ions, but the present disclosure is not limited thereto. For example, the region to be amorphized may have a smaller thickness when implanted with ions having a smaller molecular weight than CO than when implanted with CO ions. Also, the EOR region "EOR" may have a larger thickness when implanted with ions having a smaller molecular weight than CO than when implanted with CO ions.

Figure 5:
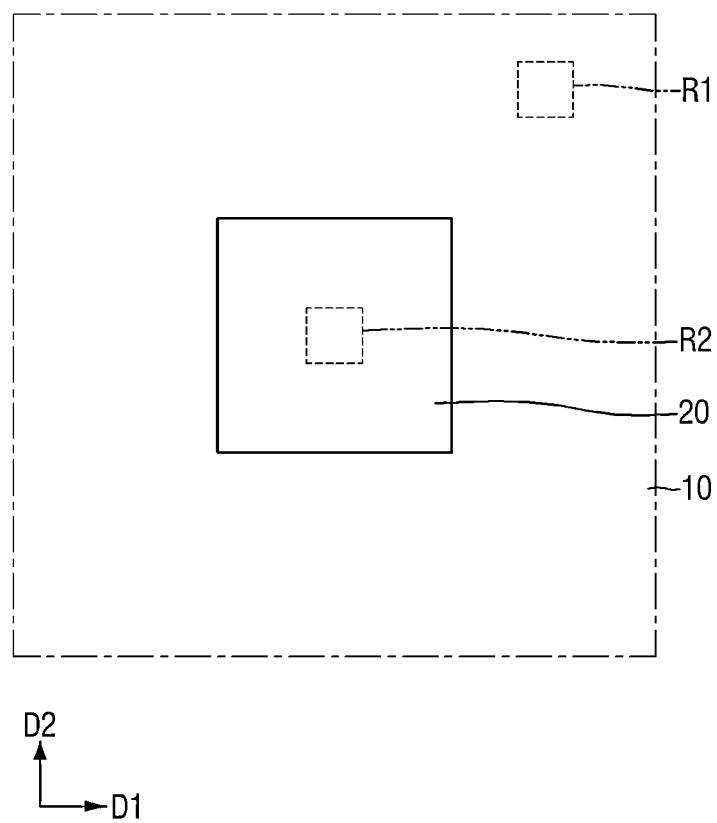
FIG. 5 is a layout view of a semiconductor device according to some example embodiments of the present disclosure.
Figure 6:
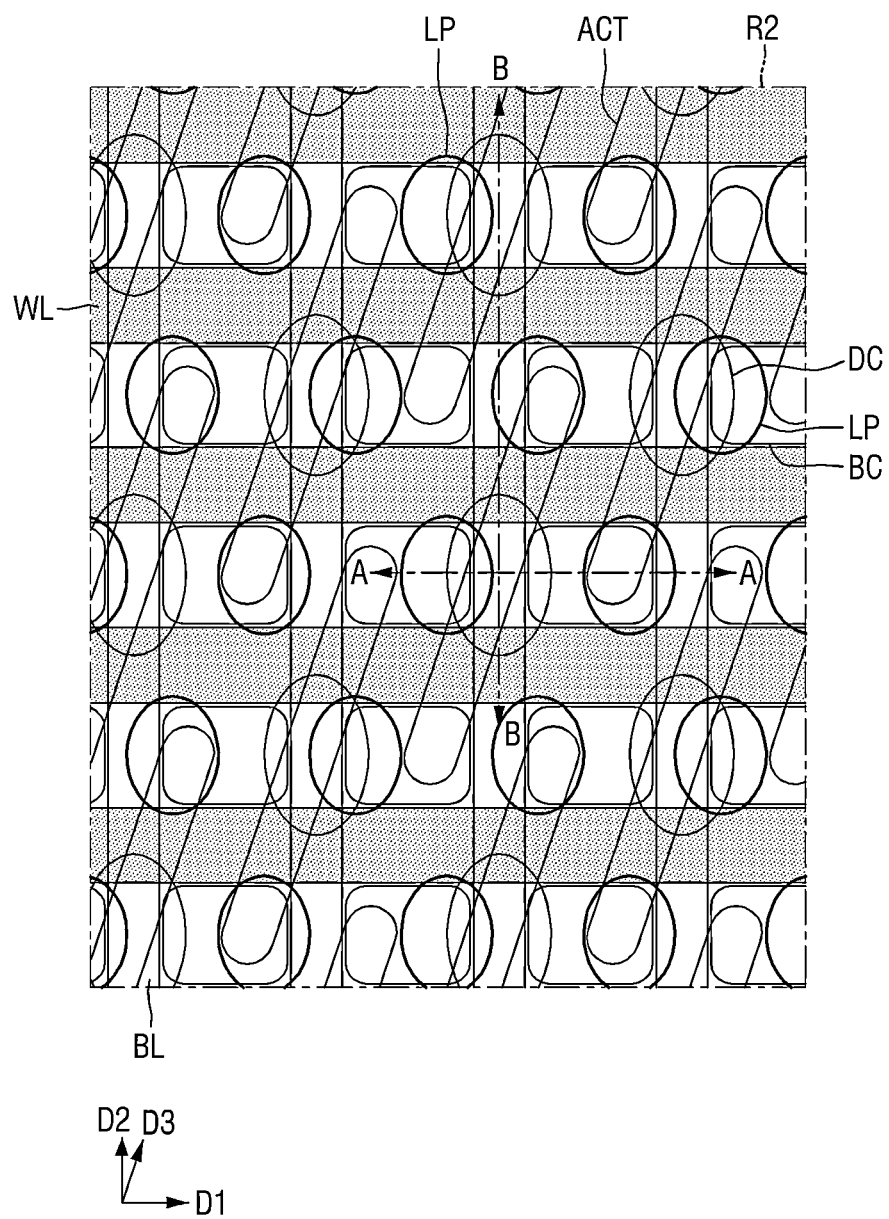
FIG. 6 is an enlarged layout view of part R2 of FIG. 5.
Figure 7:
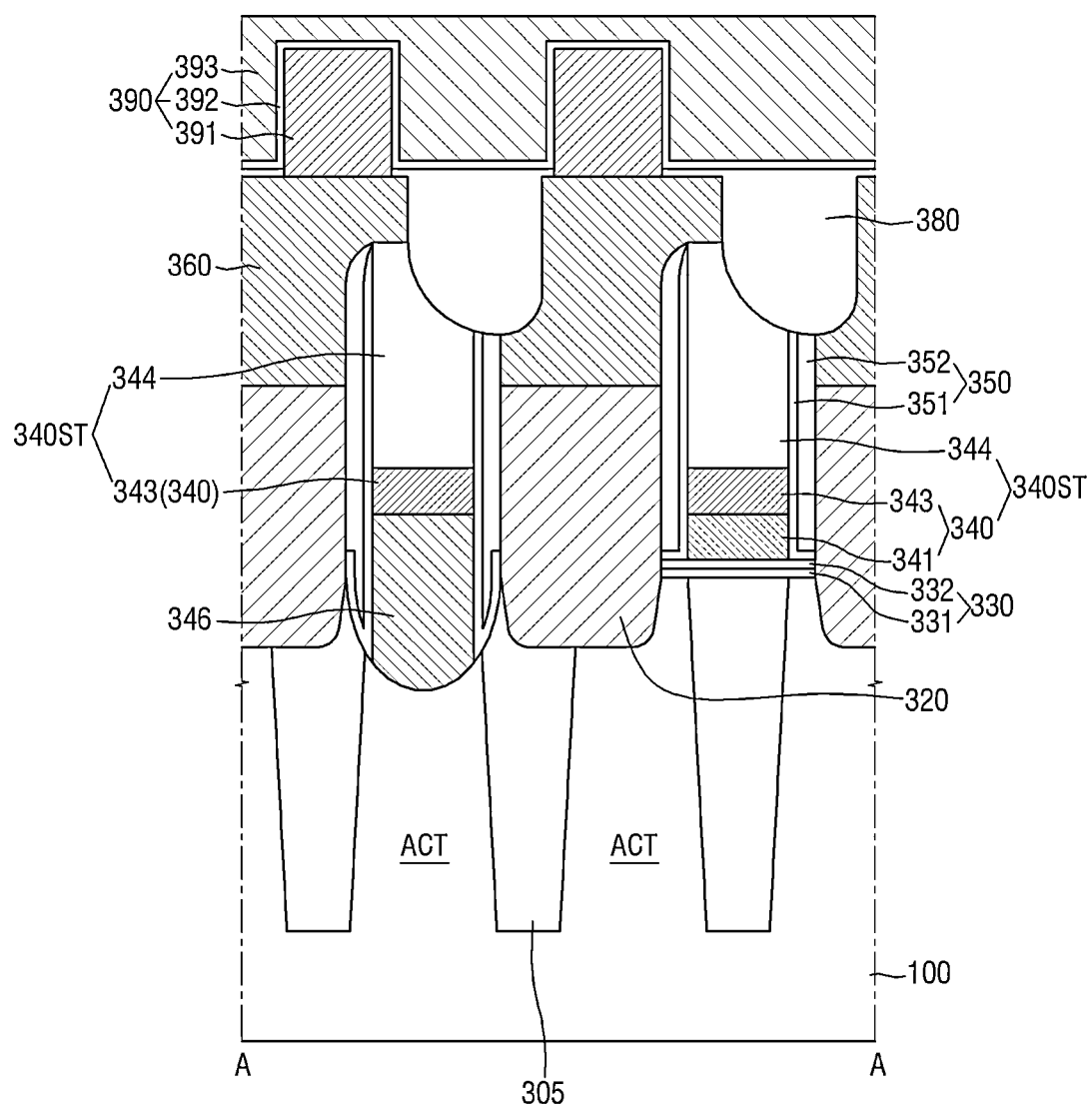
FIG. 7 is a cross-sectional view taken along line A-A of FIG. 6.
Figure 8:
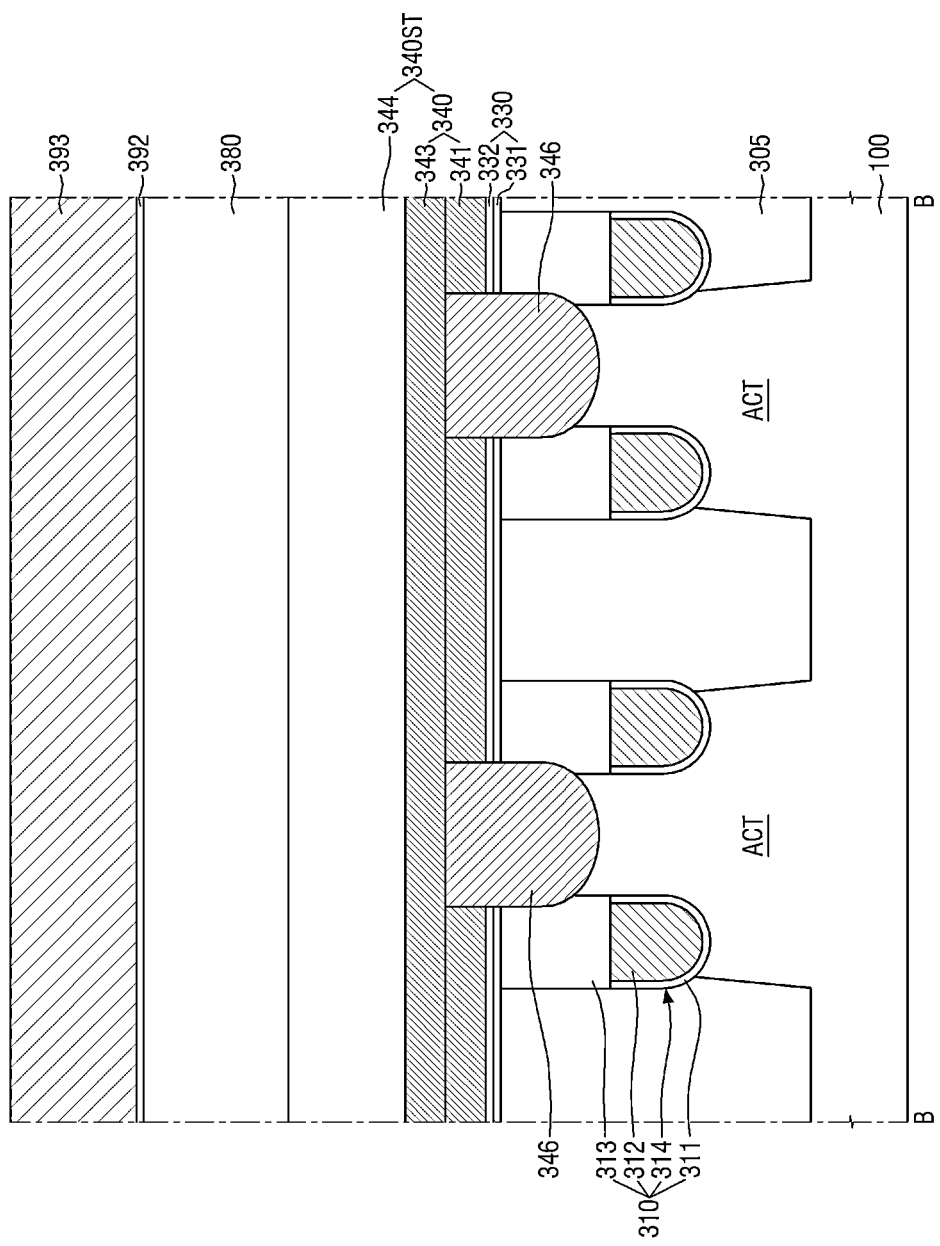
FIG. 8 is a cross-sectional view taken along line B-B of FIG. 6.

FIG. 5 is a layout view of a semiconductor device according to some example embodiments of the present disclosure. FIG. 6 is an enlarged layout view of part R2 of FIG. 5. FIG. 7 is a cross-sectional view taken along line A-A of FIG. 6. FIG. 8 is a cross-sectional view taken along line B-B of FIG. 6. FIGS. 5 through 8 illustrate a dynamic random-access memory (DRAM) as an exemplary semiconductor device, but the present disclosure is not limited thereto.

Referring to FIGS. 5 through 8, the semiconductor device according to some example embodiments of the present disclosure may include a cell region 20 and a peripheral region 10, which is defined around the cell region 20.

A substrate 100 may include the cell region 20 and the peripheral region 10. For example, the cell region 20 may be a region where memory cells are disposed, and the peripheral region 10 may be a region where circuitry for operating the memory cells of the cell region 20 is disposed.

The semiconductor device of FIGS. 1 through 4 may be disposed in the peripheral region 10.

Referring to FIG. 6, the semiconductor device according to some example embodiments of the present disclosure may include a plurality of first active regions ACT. The first active regions ACT may be defined by second device isolation films 305, which are formed in the substrate 100.

As the design rule of the semiconductor device according to some example embodiments of the present disclosure decreases, the first active regions ACT may be arranged as diagonal or oblique bars. The first active regions ACT may be in the shape of bars extending in a third direction D3.

A plurality of gate electrodes may be disposed on the first active regions ACT to extend in a first direction D1 across the first active regions ACT. The gate electrodes may extend in parallel to one another. The gate electrodes may be, for example, wordlines WL.

The wordlines WL may be arranged at regular intervals. The width of, and the distance between, the wordlines WL may be determined by the design rule of the semiconductor device according to some example embodiments of the present disclosure.

A plurality of bitlines BL, which extend in a second direction D2 to be orthogonal to the wordlines WL, may be disposed on the wordlines WL. The bitlines BL may extend in the second direction D2 across the first active regions ACT.

The bitlines BL may extend in parallel to one another. The bitlines BL may be arranged at regular intervals. The width of, and the distance between, the bitlines BL may be determined by the design rule of the semiconductor device according to some example embodiments of the present disclosure.

The semiconductor device according to some example embodiments of the present disclosure may include various contact arrangements, which are formed on the first active regions ACT. The contact arrangements may include, for example, direct contacts DC, buried contacts BCs, and landing pads LP.

The direct contacts DC may refer to contacts electrically connecting the first active regions ACT to the bitlines BL. The buried contacts BC may refer to contacts connecting the first active regions ACT to first lower electrodes 391 of first capacitors 390.

The contact areas of the buried contacts BC and the first active regions ACT may be relatively small. As a result, the landing pads LP, which have conductivity, may be provided to enlarge the contact areas of the buried contacts BC and the first active regions ACT and the contact areas of the buried contacts BC and the first lower electrodes 391 of the first capacitors 390.

The landing pads LP may be disposed between the first active regions ACT and the buried contacts BC and between the buried contacts BC and the first lower electrodes 391 of the first capacitors 390. As the contact areas of the buried contacts BC and the first active regions ACT and the contact areas of the buried contacts BC and the first lower electrodes 391 of the first capacitors 390 are enlarged by providing the landing pads LP, the contact resistance between the first active regions ACT and the first lower electrodes 391 of the first capacitors 390 may be reduced.

The direct contacts DC may be disposed in the middle parts of the first active regions ACT. The buried contacts BC may be disposed at ends of the first active regions ACT. As the buried contacts BC are disposed at the ends of the first active regions ACT, the landing pads LP may be disposed near the ends of the first active regions ACT to partially overlap with the buried contacts BC. In other words, the buried contacts BC may be formed to overlap with the first active regions ACT and the second device isolation films 305, between the wordlines WL and between the bitlines BL.

The wordlines WL may be buried in the substrate 100. The wordlines WL may be disposed across the first active regions ACT, between the direct contacts DC or between the buried contacts BC.

As illustrated in FIGS. 5 through 8, two wordlines WL may be disposed across one first active region ACT. As the first active regions ACT are disposed diagonally, the wordlines WL may have an angle of less than 90 degrees with respect to the first active regions ACT.

The direct contacts DC and the buried contacts BC may be disposed symmetrically. As a result, the direct contacts DC and the buried contacts BC may be arranged in straight lines in the first and second directions D1 and D2.

The landing pads LP, unlike the direct contacts DC and the buried contacts BC, may be arranged in a zigzag fashion in the direction in which the bitlines BL extend, e.g., in the second direction D2. Also, the landing pads LP may be disposed to overlap with the same side surfaces of the bitlines BL in the direction in which the wordlines WL extend, e.g., in the first direction D1.

For example, landing pads LP in a first row may overlap with the left side surfaces of their respective bitlines BL, and landing pads LP in a second row may overlap with the right side surfaces of their respective bitlines BL.

Referring to FIGS. 6 through 8, the semiconductor device according to some example embodiments of the present disclosure may include the second device isolation films 305, a plurality of gate structures 310, a plurality of bitline structures 350ST, bitline contacts 346, storage contacts 320, and the first capacitors 390.

The first active regions ACT, which are defined by the second device isolation films 305, may be formed as islands having a short axis and a long axis, as illustrated in FIG. 8. The first active regions ACT may be formed diagonally with respect to the wordlines WL, which are formed in the second device isolation films 305, to have an angel of less than 90 degrees with respect to the wordlines WL. Also, the first active regions ACT may be formed diagonally with respect to the bitlines BL, which are formed on the second device isolation films 305, to have an angel of less than 90 degrees with respect to the bitlines BL.

The gate structures 310 may be formed in the substrate 100 and the second device isolation films 305. The gate structures 310 may be formed across the second device isolation films 305 and the first active regions ACT, which are defined by the second device isolation films 305. That is, the gate structures 310 may be formed in the substrate 100 and the second device isolation films 305, which are positioned in the direction in which the gate structures 310 extend, e.g., in the first direction D1.

The gate structures 310 may include third gate trenches 314, third gate insulating films 311, first gate electrodes 312, and gate capping patterns 313, which are formed in the substrate 100 and the second device isolation films 305. The first gate electrodes 312 may correspond to the wordlines WL.

The third gate insulating films 311 may extend along the sidewalls and the bottoms of the third gate trenches 314. The third gate insulating films 311 may include at least one of silicon oxide, silicon nitride, silicon oxynitride, and/or a high-k material having a greater dielectric constant than silicon oxide.

The first gate electrodes 312 may be formed on the third gate insulating films 311. The first gate electrodes 312 may fill parts of the third gate trenches 314. The first gate electrodes 312 may include at least one of a metal, a conductive metal nitride, a conductive metal carbonitride, a conductive metal carbide, a metal silicide, a doped semiconductor material, a conductive metal oxynitride, and a conductive metal oxide. The first gate electrodes 312 may be formed of, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but the present disclosure is not limited thereto.

Although not specifically illustrated, impurity-doped regions may be formed on at least one side of each of the gate structures 310. The impurity-doped regions may be source/drain regions of transistors.

The gate capping patterns 313 may be formed on the first gate electrodes 312. The gate capping patterns 313 may fill parts of the third gate trenches 314 that are not filled with the first gate electrodes 312. The gate capping patterns 313 may include an insulating material.

The bitline structures 340ST may include cell conductive lines 340 and cell line capping films 344. The cell conductive lines 340 may be formed on the substrate 100 and the second device isolation films 305 where the gate structures 310 are formed. The cell conductive lines 340 may intersect the second device isolation films 305 and the first active regions ACT, which are defined by the second device isolation films 305. The cell conductive lines 340 may be formed on the substrate and the second device isolation films 305, which are positioned in the direction in which the cell conductive lines 340 extend, e.g., in the second direction D2. The cell conductive lines 340 may be formed to intersect the gate structures 310. The cell conductive lines 340 may correspond to the bitlines BL.

The cell conductive lines 340 may include lower cell conductive lines 341 and upper cell conductive lines 342, which are on the lower cell conductive lines 341. The cell conductive lines 340 may have a multifilm structure.

The bitline contacts 346 may be formed between the substrate 100 and the cell conductive lines 340. That is, the cell conductive lines 340 may be formed on the bitline contacts 346. For example, the bitline contacts 346 may be formed at locations where the cell conductive lines 340 intersect the middle parts of the first active regions ACT. The bitline contacts 346 may be formed between the cell conductive lines 340 and parts of the substrate 100 in the middle parts of the first active regions ACT. The bitline contacts 346 may electrically connect the substrate 100 and the cell conductive lines 340. The bitline structures 340ST may be connected to the first active regions ACT through the bitline contacts 346. The bitline contacts 346 may correspond to the direct contacts DC. The bitline contacts 346 may include at least one of, for example, a semiconductor material doped with impurities, a conductive silicide compound, a conductive metal nitride, a conductive metal oxide, and a metal.

The cell line capping films 344 may be disposed on the cell conductive lines 340. The cell line capping films 344 may include an insulating material.

The cell insulating films 330 may be formed on the substrate 100 and the second device isolation films 305. The cell insulating films 330 may be formed on the substrate 100 and the second device isolation films 305 where the bitline contacts 346 are not formed. The cell insulating films 330 may be formed between the substrate 100 and the cell conductive lines 340 and between the second device isolation films 305 and the cell conductive lines 340. The cell insulating films 330 may be single films or may be multifilms including first cell insulating films 331 and second cell insulating films 332. For example, the first cell insulating films 331 may include, but are not limited to, oxide films, and the second cell insulating films 332 may include, but are not limited to, nitride films.

Cell line spacers 350 may be disposed on sidewalls of the cell conductive lines 340 and sidewalls of the cell line capping films 344. The cell line spacers 350 may be single films or may be multi-films including first cell line spacers 351 and second cell line spacers 352. For example, the first cell line spacers 351 and the second cell line spacers 352 may include silicon oxide films, silicon nitride films, silicon oxynitride (SiON) films, silicon oxycarbonitride (SiOCN) films, the air, and a combination thereof, but the present disclosure is not limited thereto.

The storage contacts 320 may be formed between the cell conductive lines 340. The storage contacts 320 may overlap with the substrate 100 and the second device isolation films 305, between the cell conductive lines 340. The storage contacts 320 may correspond to the buried contacts BC. The storage contacts 320 may include at least one of, for example, a semiconductor material doped with impurities, a conductive silicide compound, a conductive metal nitride, a conductive metal oxide, and a metal.

The storage pads 360 may be formed on the storage contacts 320. The storage pads 360 may be electrically connected to the storage contacts 320. The storage pads 360 may correspond to the landing pads LP. The storage pads 360 may include at least one of, for example, a semiconductor material doped with impurities, a conductive silicide compound, a conductive metal nitride, a conductive metal oxide, and/or a metal.

Pad isolation insulating films 380 may be formed on the storage pads 360 and the bitline structures 340ST. For example, the pad isolation insulating films 380 may be disposed on the cell line capping films 344. The pad isolation insulating films 380 may define the areas for the storage pads 360 that form a plurality of isolated areas. The pad isolation insulating films 380 may be patterned to expose at least parts of the top surfaces of the storage pads 360. The pad isolation insulating films 380 may include an insulating material.

The first capacitors 390 may be formed in the pad isolation insulating films 380. The first capacitors 390 may be electrically connected to the storage contacts 320 through the storage pads 360. The first capacitors 390 may include the first lower electrodes 391, first capacitor dielectric films 392, and first upper electrodes 393.

The first lower electrodes 391 may be disposed on the storage pads 360. The first lower electrodes 391 may have a pillar shape, but the present disclosure is not limited thereto. Alternatively, the first lower electrodes 391 may have a cylindrical shape. The first capacitor dielectric films 392 may be formed on the first lower electrodes 391. The first capacitor dielectric films 392 may be formed along the profiles of the first lower electrodes 391. The first upper electrodes 393 are formed on the first capacitor dielectric films 392. The first upper electrodes 393 may surround the outer sidewalls of the first lower electrodes 391.

The first lower electrodes 391 and the first upper electrodes 393 may include, for example, a doped semiconductor material, a conductive metal nitride (e.g., titanium nitride, tantalum nitride, niobium nitride, or tungsten nitride), a metal (e.g., Ru, Ir, Ti, or Ta), and/or a conductive metal oxide (e.g., iridium oxide or niobium oxide), but the present disclosure is not limited thereto.

The first capacitor dielectric films 392 may include one of, for example, silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof.

Figure 9:
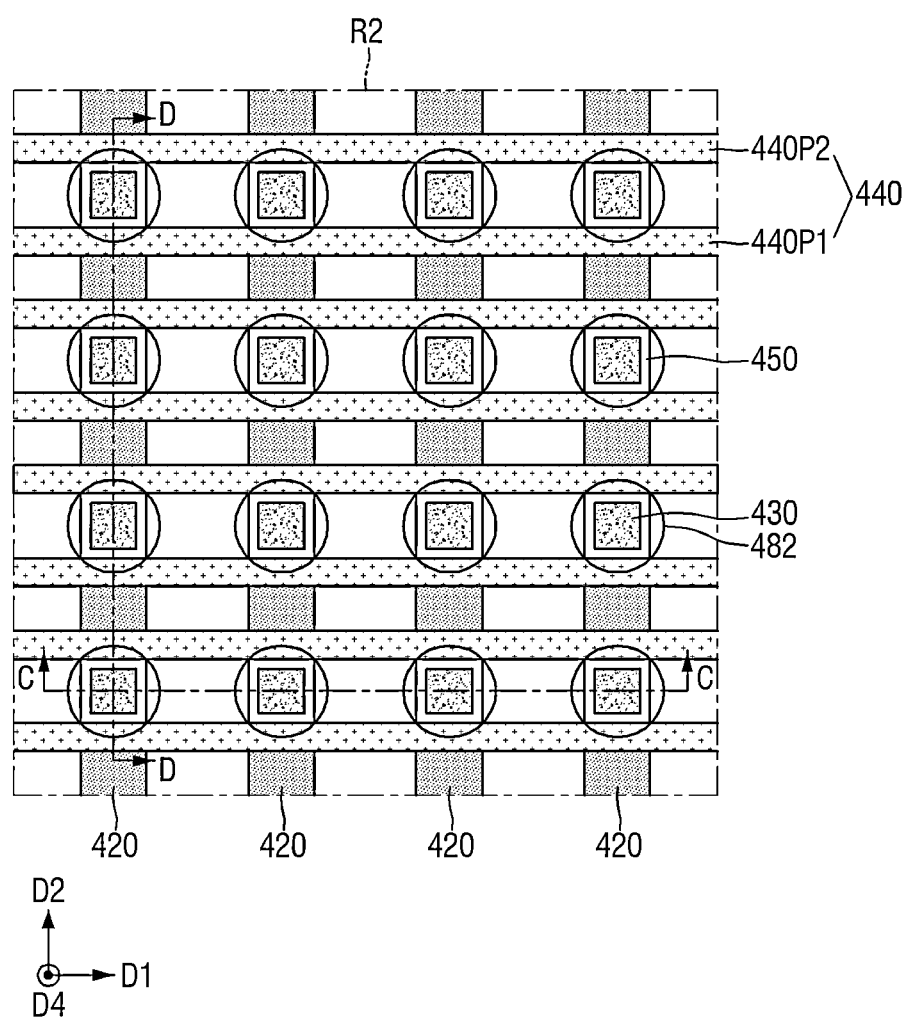
FIG. 9 is a layout view of a semiconductor device according to some example embodiments of the present disclosure.
Figure 10:
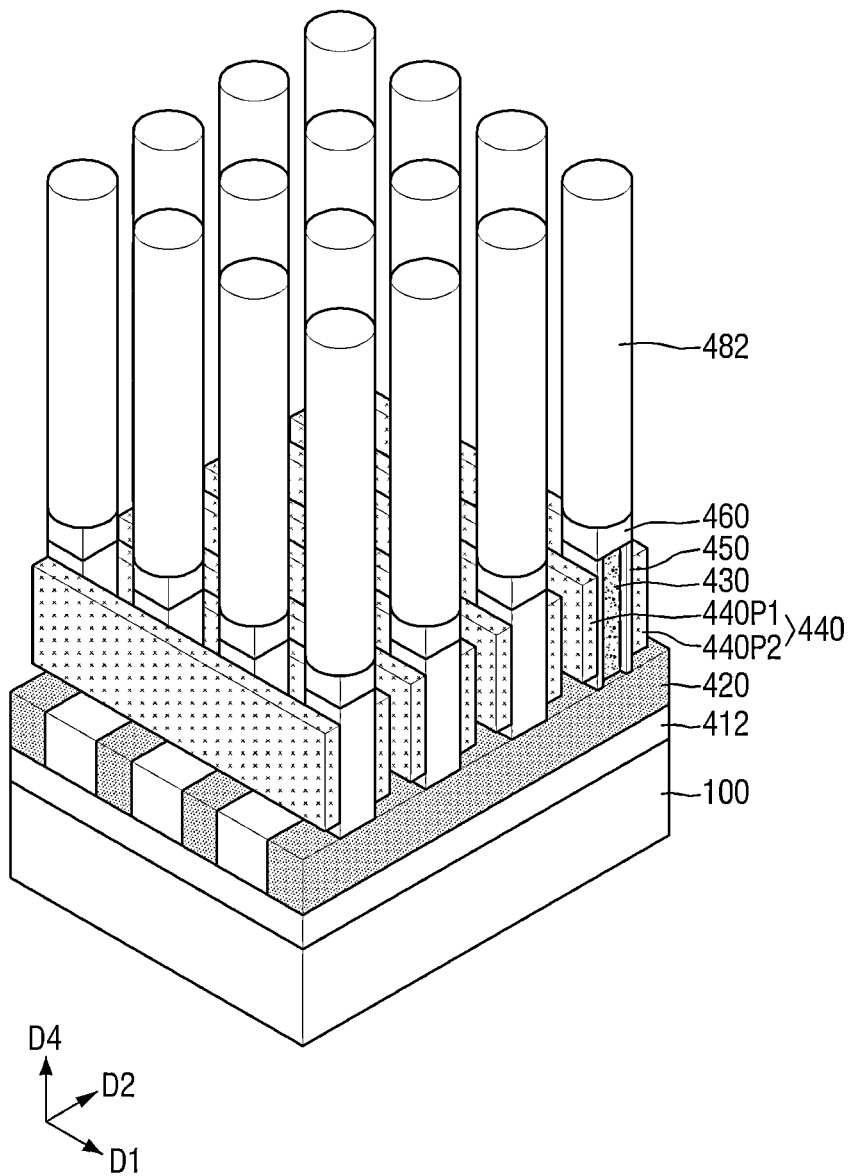
FIG. 10 is a perspective view of the semiconductor device of FIG. 9.
Figure 11:
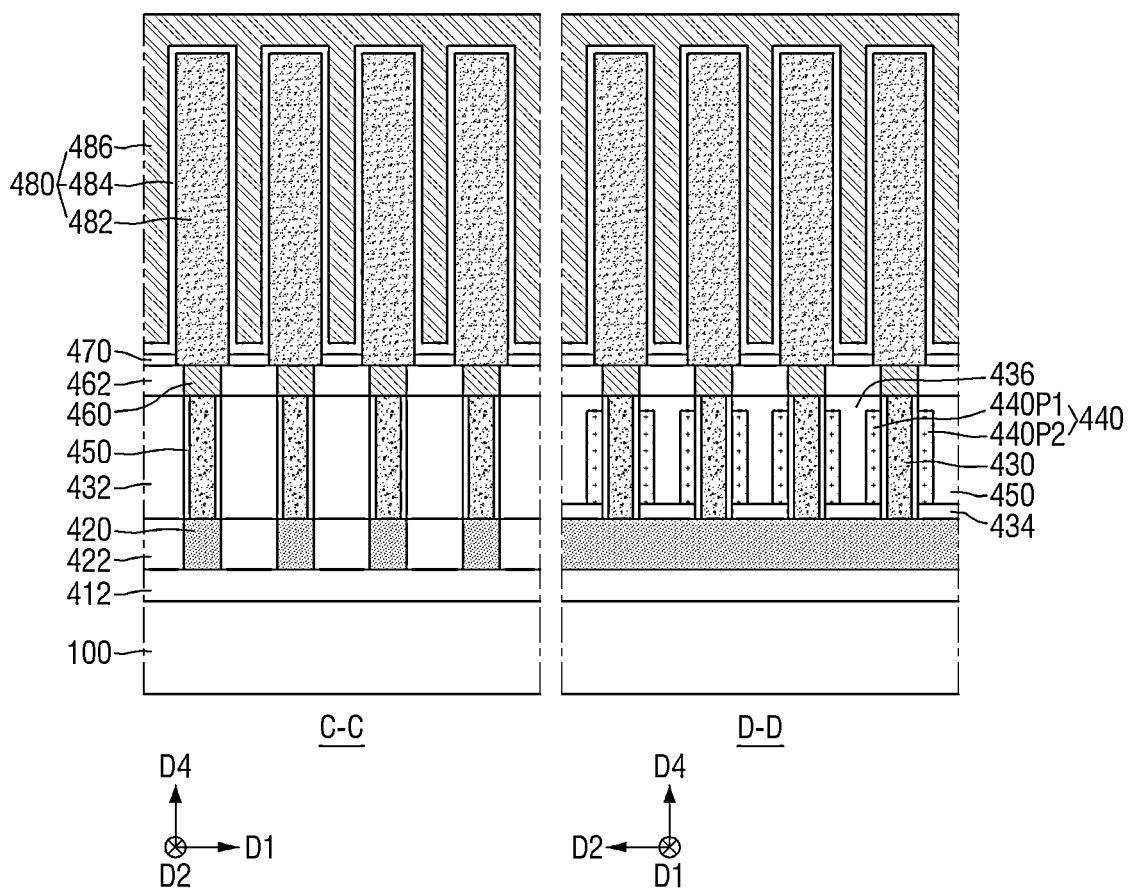
FIG. 11 is a cross-sectional view taken along lines C-C and D-D of FIG. 10.

FIG. 9 is a layout view of a semiconductor device according to some example embodiments of the present disclosure. FIG. 10 is a perspective view of the semiconductor device of FIG. 9. FIG. 11 is a cross-sectional view taken along lines C-C and D-D of FIG. 10. FIG. 9 may be an enlarged layout view of part R2 of FIG. 5.

Referring to FIGS. 9 through 11, the semiconductor device according to some example embodiments of the present disclosure may include a substrate 100, a plurality of first conductive lines 420, channel layers 430, second gate electrodes 440, fourth gate insulating films 450, and second capacitors 480. The semiconductor device according to some example embodiments of the present disclosure may be a memory device including vertical channel transistors (VCTs). The VCTs may refer to a structure where the channel layers 430 extend in a direction perpendicular to the substrate 100.

A lower insulating film 412 may be disposed on the substrate 100. The first conductive lines 420 may be spaced apart from one another in a first direction D1, on the lower insulating layer 412, and may extend in a second direction D2. A plurality of first insulating patterns 422 may be disposed to fill the gaps between the first conductive lines 420. The first insulating patterns 422 may extend in the second direction D2. The top surfaces of the first insulating patterns 422 may be on the same level as the top surfaces of the first conductive lines 420. The first conductive lines 420 may function as bitlines.

The first conductive lines 420 may include a doped semiconductor material, a metal, a conductive metal nitride, a conductive metal silicide, a conductive metal oxide, or a combination thereof. For example, the first conductive lines 420 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but the present disclosure is not limited thereto. Each of the first conductive lines 420 may include a single layer or multiple layers of any one of the above-described materials. The first conductive lines 420 may include graphene, carbon nanotubes, or a combination thereof.

The channel layers 430 may be arranged on the first conductive lines 420 in a matrix to be spaced apart from one another in the first and second directions D1 and D2. The channel layers 430 may have a first width in the first direction D1 and a first height in a fourth direction D4, and the first height may be greater than the first width. The fourth direction D4 may intersect the first and second directions D1 and D2 and may be orthogonal to, for example, the top surface of the substrate 100. For example, the first height may be about two to about ten times the first width, such as about two times, or about five times, or about ten times the first width, but the present disclosure is not limited thereto. Lower portions of the channel layers 430 may function as third source/drain regions (not illustrated), and upper portions of the channel layers 430 may function as fourth source/drain regions (not illustrated). Middle portions of the channel layers 430 between the lower portions and the upper portions of the channel layers 430 may function as channel regions (not illustrated).

The channel layers 430 may include an oxide semiconductor, and the oxide semiconductor may include, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. Each of the channel layers 430 may include a single layer or multiple layers of the oxide semiconductor. In some example embodiments, the channel layers 430 may have a bandgap energy greater than Si. For example, the channel layers 430 may have a bandgap energy of about 1.5 eV to about 5.6 eV. For example, the channel layers 430 may have an optimal channel performance when having a bandgap energy of about 2.0 eV to about 4.0 eV. For example, the channel layers 430 may be polycrystalline or amorphous, but the present disclosure is not limited thereto. The channel layers 430 may include graphene, carbon nanotubes, or a combination thereof.

The second gate electrodes 440 may extend in the first direction D1 on both sidewalls of each of the channel layers 430. The second gate electrodes 440 may include first sub-gate electrodes 440P1, which face first sidewalls of the channel layers 430, and second sub-gate electrodes 440P2, which face second sidewalls of the channel layers 430 that are opposite to the first sidewalls of the channel layers 430. As the channel layers 430 are disposed between the first sub-gate electrodes 440P1 and the second sub-gate electrodes 440P2, the semiconductor device according to some example embodiments of the present disclosure may have a dual-gate transistor structure. However, the present disclosure is not limited to this. Alternatively, the second sub-gate electrodes 440P2 may not be provided, and only the first sub-gate electrodes 440P1, which face the first sidewalls of the channel layers 430, may be formed so that a single-gate transistor structure may be implemented. The material of the second gate electrodes 440 may be the same as the material of the first gate electrodes 312.

The fourth gate insulating films 450 may surround the sidewalls of each of the channel layers 430 and may be interposed between the channel layers 430 and the second gate electrodes 440. For example, as illustrated in FIG. 11, all the sidewalls of each of the channel layers 430 may be surrounded by the fourth gate insulating films 450 and parts of the sidewalls of each of the second gate electrodes 440 may be in contact with the fourth gate insulating films 440.

In another example, the fourth gate insulating films 450 may extend in the same direction as the second gate electrodes 440 (e.g., in the first direction D1), and only two sidewalls of each of the channel layers 430 that face the second gate electrodes 440 may be in contact with the fourth gate insulating films 450. The fourth gate insulating films 450 may be formed of silicon oxide, silicon oxynitride, a high-k material having a greater dielectric constant than silicon oxide, or a combination thereof.

A plurality of second insulating patterns 432 may extend in the second direction D2, on the first insulating patterns 422. The channel layers 430 may be disposed between the second insulating patterns 432. Also, first buried layers 434 and second buried layers 436 may be disposed between the channel layers 430, between the second insulating patterns 432. The first buried layers 434 may be disposed at the bottoms of the gaps between the channel layers 430. The second buried layers 436 may be formed to fill the gaps between the channel layers 430 on the first buried layers 434. The top surfaces of the second buried layers 436 may be disposed on the same level as the top surfaces of the channel layers 430, and the second buried layers 436 may cover the top surfaces of the second gate electrodes 440. Alternatively, the second insulating patterns 432 may be formed as material layers that are continuous from the first insulating patterns 422, or the second buried layers 436 may be formed as material layers that are continuous from the first buried layers 434.

Capacitor contacts 460 may be disposed on the channel layers 430. The capacitor contacts 460 may be disposed to perpendicularly overlap with the channel layers 430 and may be arranged in a matrix to be spaced apart from one another in the first and second directions D1 and D2. The capacitor contacts 460 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but the present disclosure is not limited thereto. Upper insulating layers 462 may surround the sidewalls of each of the capacitor contacts 460, on the second insulating patterns 432 and the second buried layers 436.

Etching stopper films 470 may be disposed on the upper insulating layers 462. The second capacitors 480 may be disposed on the etching stopper films 470. The second capacitors 480 may include second lower electrodes 482, second capacitor dielectric films 484, and second upper electrodes 486. The second lower electrodes 482 may be electrically connected to the top surfaces of the capacitor contacts 460 through the etching stopper films 470. The second lower electrodes 482 may be formed in a pillar shape extending in the fourth direction D4, but the present disclosure is not limited thereto. The second lower electrodes 482 may be disposed to perpendicularly overlap with the capacitor contacts 460 and may be arranged in a matrix to be spaced apart from one another in the first and second directions D1 and D2. Alternatively, landing pads (not illustrated) may be further disposed between the capacitor contacts 460 and the second lower electrodes 482 so that the second lower electrodes 482 may be arranged in a hexagonal shape.

Figure 12:
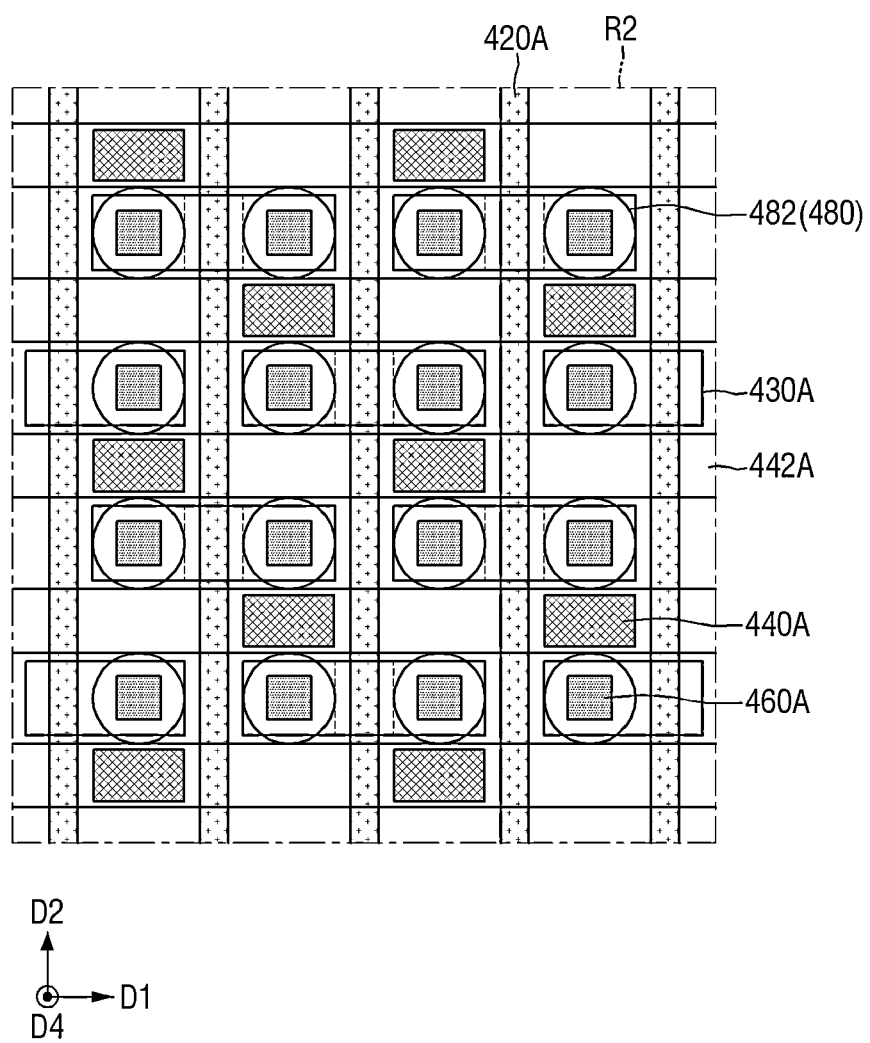
FIG. 12 is a layout view of a semiconductor device according to some example embodiments of the present disclosure.
Figure 13:
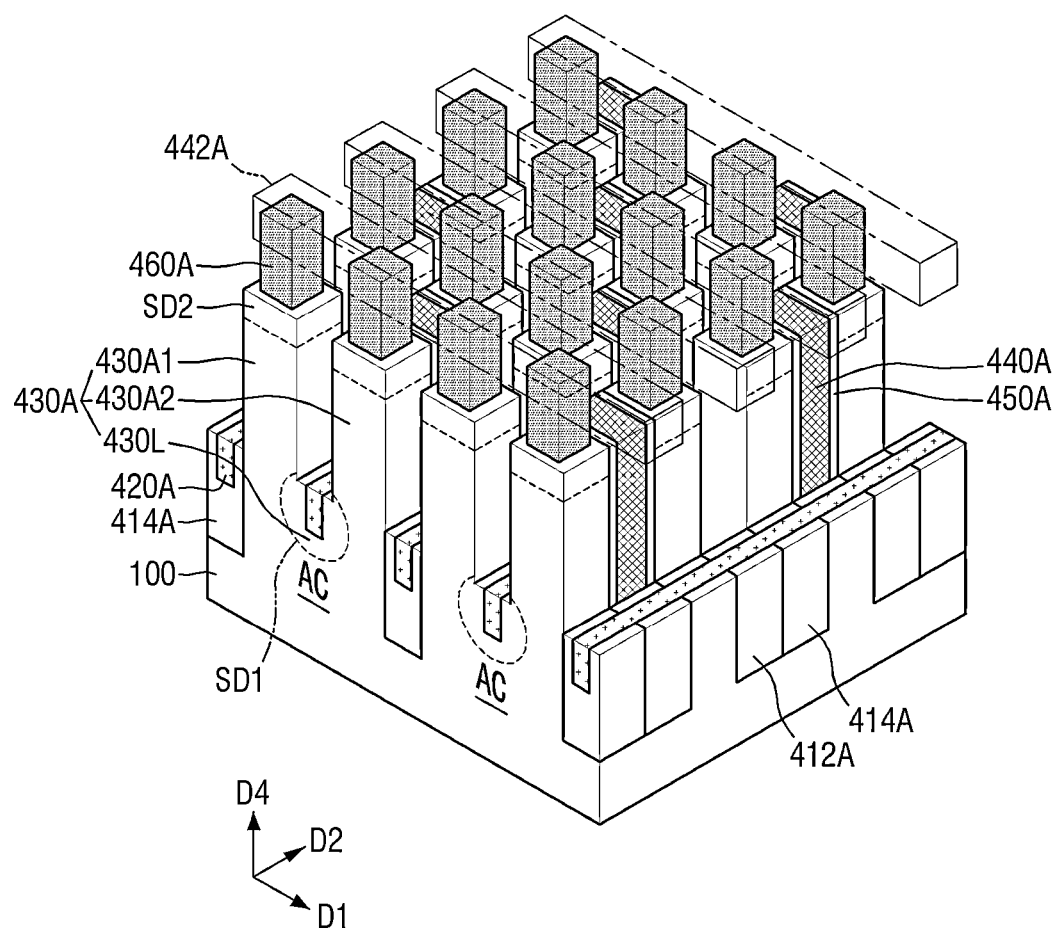
FIG. 13 is a perspective view of the semiconductor device of FIG. 12.

FIG. 12 is a layout view of a semiconductor device according to some example embodiments of the present disclosure. FIG. 13 is a perspective view of the semiconductor device of FIG. 12.

Referring to FIGS. 12 and 13, the semiconductor device according to some example embodiments of the present disclosure may include a substrate 100, a plurality of first conductive lines 420A, channel structures 430A, contact gate electrodes 440A, a plurality of second conductive lines 442A, and second capacitors 480. The semiconductor device according to some example embodiments of the present disclosure may be a memory device including VCTs.

A plurality of second active regions AC may be defined in the substrate 100 by first device isolation patterns 412A and second device isolation patterns 414A. The channel structures 430A may be disposed in their respective second active regions AC. Each of the channel structures 430A may include first and second active pillars 430A1 and 430A2, which extend in a vertical direction, and a connector 430L, which is connected to lower portions of the first and second active pillars 430A1 and 430A2. Fifth source/drain regions SD1 may be disposed in connectors 430L. Sixth source/drain regions SD2 may be disposed above first active pillars 430A1 and second active pillars 430A2. The first active pillars 430A1 and the second active pillars 430A2 may form independent unit memory cells.

The first conductive lines 420A may extend, for example, in a second direction D2, to intersect the second active regions AC. The first conductive lines 420A may be disposed on the connectors 430L, between the first active pillars 430A1 and the second active pillars 420A2. The first conductive lines 420A may be disposed on the fifth source/drain regions SD1. The first conductive lines 420A may be disposed between the channel structures 430A. Each of the first conductive lines 420A may function as a common bitline for each pair of adjacent unit memory cells formed by first and second active pillars 430A1 and 430A2 on both sides of a corresponding first conductive line 420A.

Each of the contact gate electrodes 440A may be disposed between a pair of adjacent channel structures 430A in the second direction D2. For example, each of the contact gate electrodes 440A may be disposed between first and second active pillars 430A1 and 430A2 of a pair of adjacent channel structures 430A. Each of the contact gate electrodes 440A may be shared by first and second active pillars 430A1 and 430A2 disposed on both sides thereof Fourth gate insulating films 450A may be disposed between the contact gate electrodes 440A and the first active pillars 430A1 and between the contact gate electrodes 440A and the second active pillars 430A2. The second conductive lines 442A may extend in a first direction D1 on the top surfaces of the contact gate electrodes 440A. The second conductive lines 442A may function as wordlines.

Capacitor contacts 460A may be disposed on the channel structures 430A. The capacitor contacts 460A may be disposed on the sixth source/drain regions SD2, and the second capacitors 480 may be disposed on the capacitor contacts 460A.

Figure 14:
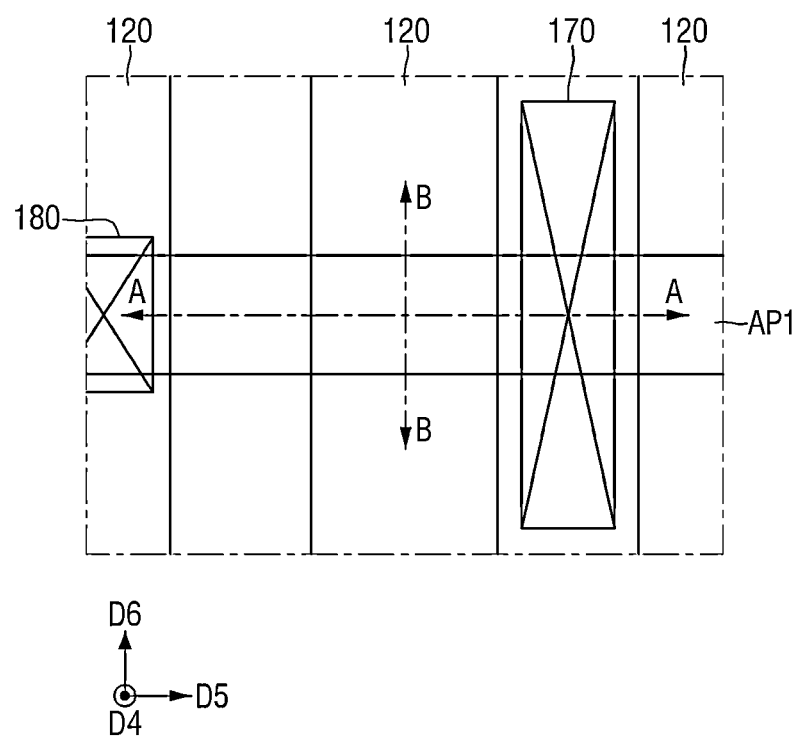
FIG. 14 is a layout view of a semiconductor device according to some example embodiments of the present disclosure.
Figure 15:
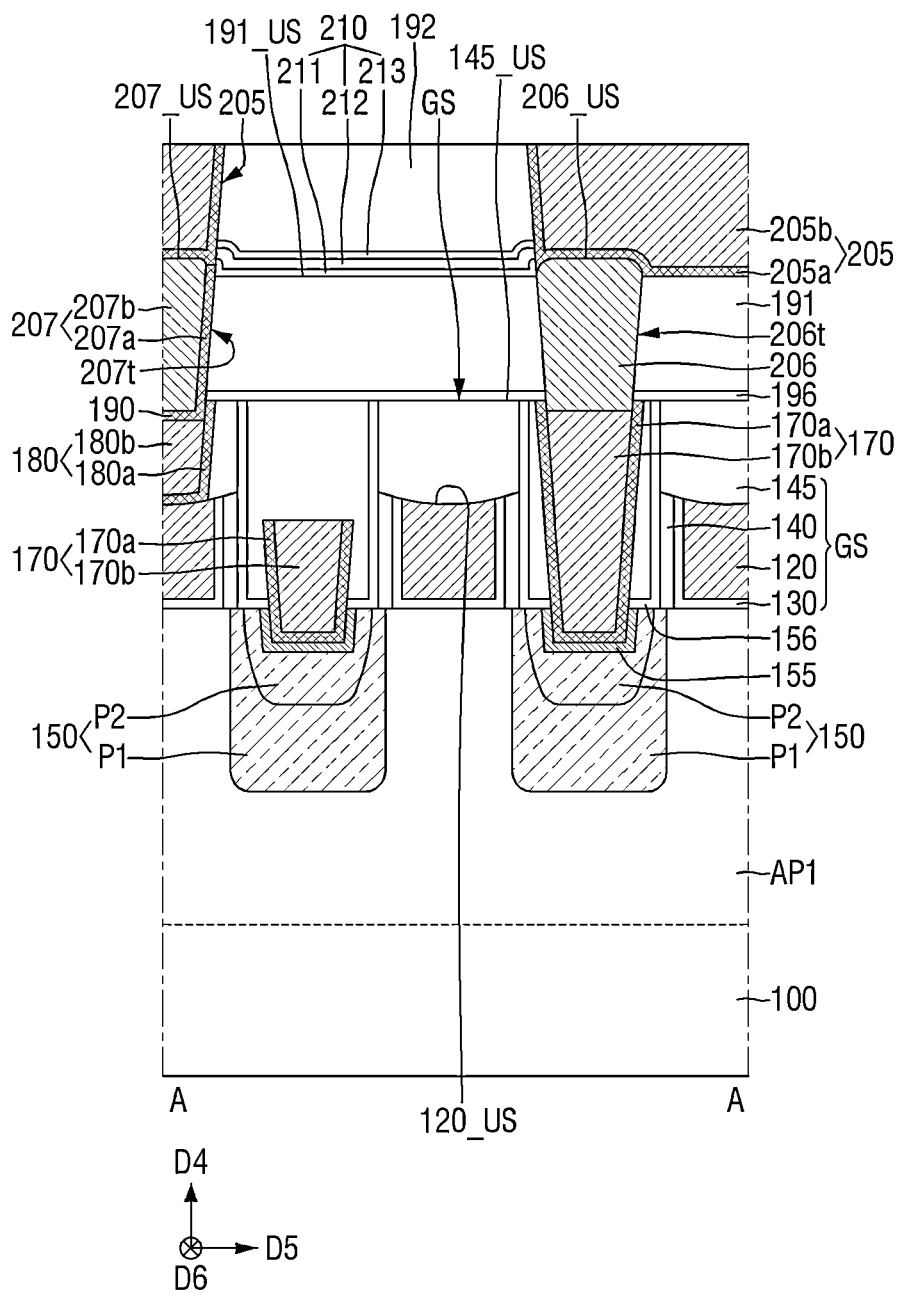
FIG. 15 is a cross-sectional view taken along line A-A of FIG. 14.
Figure 16:
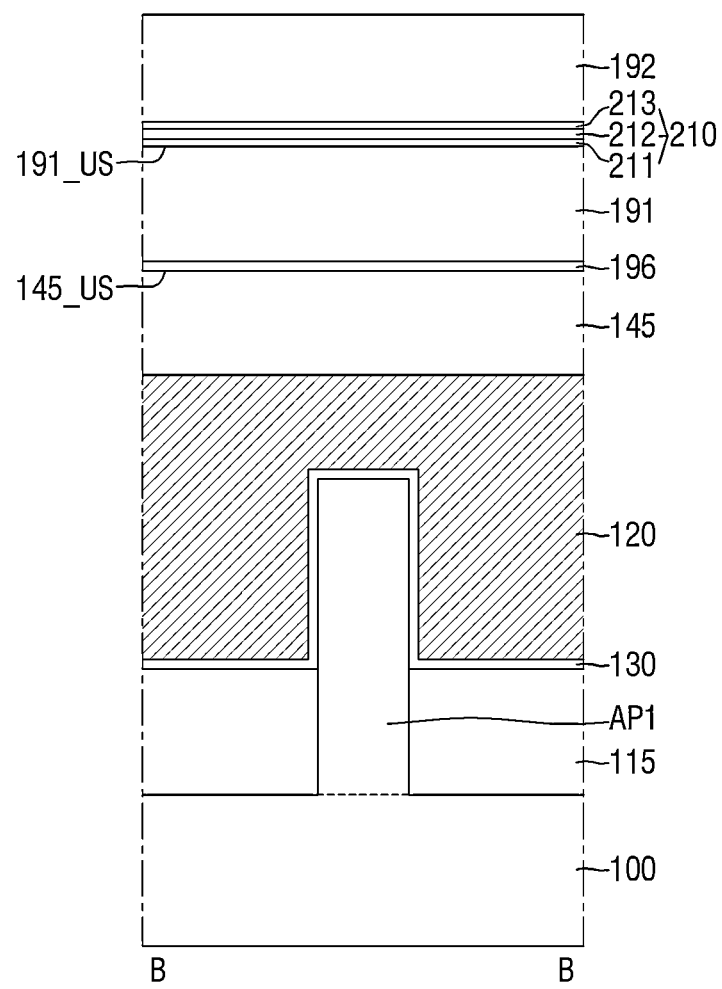
FIG. 16 is a cross-sectional view taken along line B-B of FIG. 14.
Figure 17:
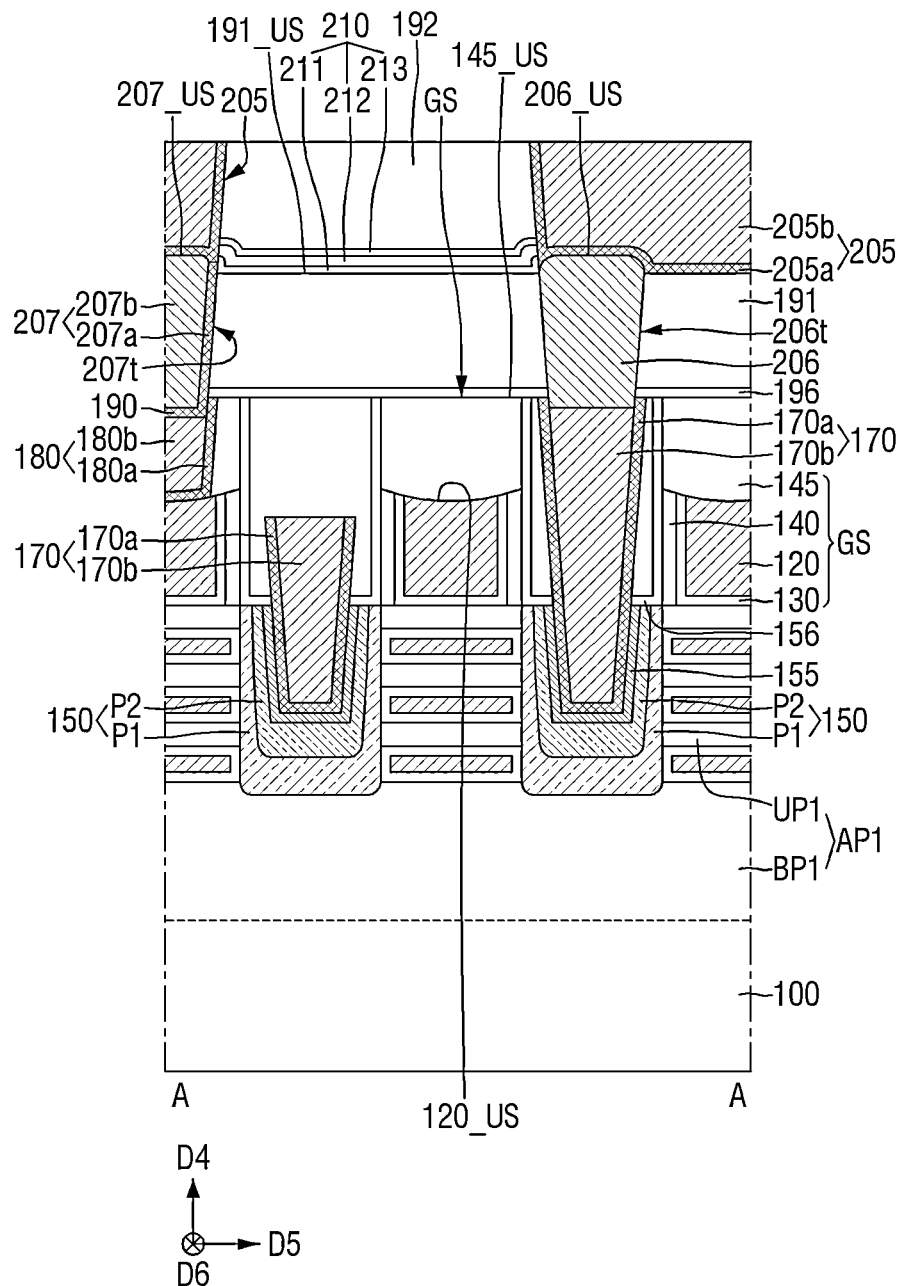
FIG. 17 is a cross-sectional view taken along line A-A of FIG. 14.
Figure 18:
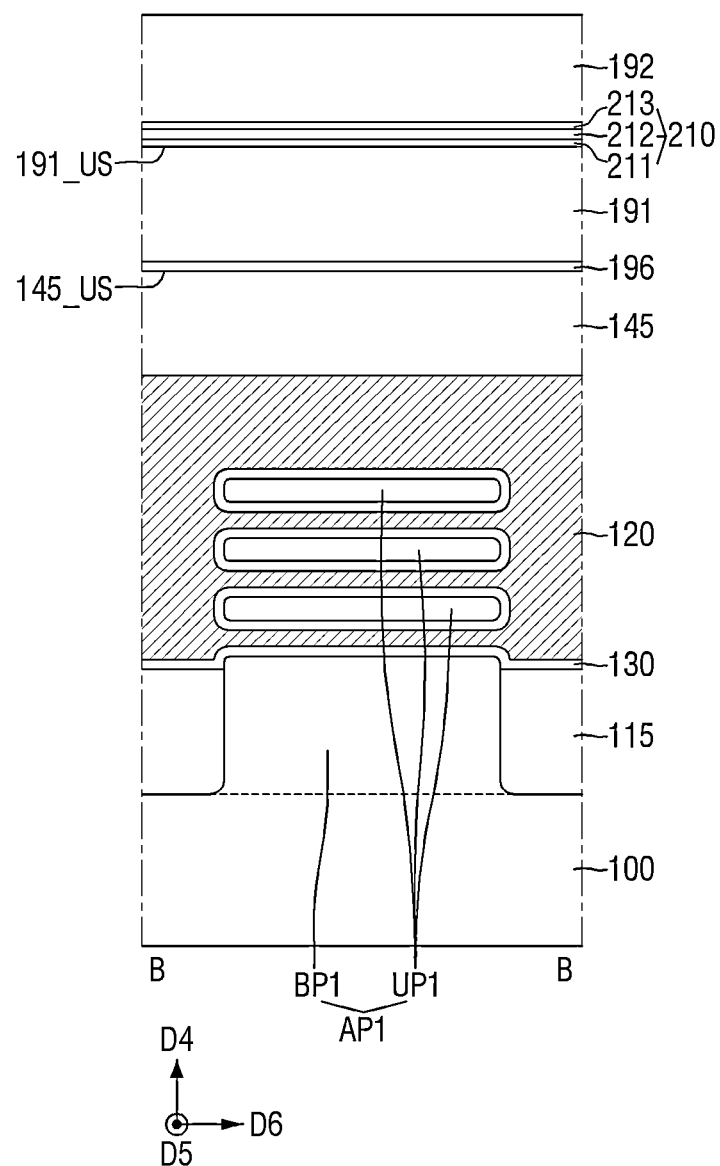
FIG. 18 is a cross-sectional view taken along line B-B of FIG. 14.

FIG. 14 is a layout view of a semiconductor device according to some example embodiments of the present disclosure. FIG. 15 is a cross-sectional view taken along line A-A of FIG. 14. FIG. 16 is a cross-sectional view taken along line B-B of FIG. 14. FIG. 17 is a cross-sectional view taken along line A-A of FIG. 14. FIG. 18 is a cross-sectional view taken along line B-B of FIG. 14.

Referring to FIGS. 14 through 16, the semiconductor device according to some example embodiments of the present disclosure may include a first active pattern AP1, one or more first gate electrodes 120, first source/drain regions 150, a first source/drain contact 170, a first gate contact 180, a first via plug 206, a second via plug 207, and wiring lines 205.

The first active pattern AP1 may protrude from a substrate 100. The first active pattern AP1 may extend in a fifth direction D5 on the substrate 100. For example, the first active pattern AP1 may have long sides extending in the fifth direction D5 and short sides extending in a sixth direction D6. The fifth direction D5 may intersect a fourth direction D4 and the sixth direction D6. The sixth direction D6 may intersect the fourth direction D4. The fourth direction D4 may refer to the thickness direction of the substrate 100.

The first active pattern AP1 may be a multi-channel active pattern. The first active pattern AP1 may be, for example, a fin-type pattern. The first active pattern AP1 may be used as the channel region of each transistor. FIGS. 14 through 16 illustrate that only one first active pattern AP1 is provided, but the present disclosure is not limited thereto. Alternatively, more than one first active patterns AP1 may be provided.

The first active pattern AP1 may account for part of the substrate 100 and may include an epitaxial layer grown from the substrate 100. The first active pattern AP1 may include, for example, an element semiconductor material such as Si or germanium (Ge). Also, the first active pattern AP1 may include a compound semiconductor such as, for example, a group IV-IV compound semiconductor or a group III-V compound semiconductor.

The group IV-IV compound semiconductor may be, for example, a binary or ternary compound including at least two of C, Si, Ge, and tin (Sn) or a compound obtained by doping the binary or ternary compound with a group IV element.

The group III-V compound semiconductor may be, for example, a binary, ternary, quaternary compound obtained by combining at least one group III element such as Al, Ga, and In with a group IV element such as phosphorus (P), arsenic (As), or antimony (Sb).

Field insulating films 115 may be formed on the substrate 100. The field insulating films 115 may be formed on parts of sidewalls of the first active pattern AP1. The first active pattern AP1 may protrude beyond the top surface of the first active pattern AP1. The field insulating films 115 may include, for example, oxide films, nitride films, oxynitride films, or a combination thereof.

One or more gate structures GS may be disposed on the substrate 100. For example, the gate structures GS may be disposed on the field insulating films 115. The gate structures GS may extend in the sixth direction D6. The gate structures GS may be spaced apart from one another in the fifth direction D5.

The gate structures GS may be disposed on the first active pattern AP1. The gate structures GS may intersect the first active pattern AP1.

The gate structure GS may include, for example, the first gate electrodes 120, first gate insulating films 130, first gate spacers 140, and first gate capping patterns 145.

The first gate electrodes 120 may be formed on the first active pattern AP1. The first gate electrodes 120 may intersect the first active pattern AP1. The first gate electrodes 120 may surround parts of the first active pattern AP1 that protrude beyond the top surfaces of the field insulating films 115. Each of the first gate electrodes 120 may have long sides extending in the sixth direction D6 and short sides extending in the fifth direction D5.

Top surfaces 120US of the first gate electrodes 120 may be concave surfaces recessed toward the top surface of the first active pattern AP1, but the present disclosure is not limited thereto. Alternatively, the top surfaces 120US of the first gate electrodes 120 may be flat.

The first gate spacers 140 may be disposed on the sidewalls of the first gate electrodes 120. The first gate spacers 140 may extend in the sixth direction D6.

The first gate insulating films 130 may extend along the sidewalls and the bottom surfaces of the first gate electrodes 120. The first gate insulating films 130 may be formed on the first active pattern AP1, and the field insulating films 115. The first gate insulating films 130 may be formed between the first gate electrode 120 and the first gate spacers 140.

The first gate insulating films 130 may be formed along the profiles of the parts of the first active pattern AP1 that protrude beyond the field insulating films 115 and along the top surfaces of the field insulating films 115. Although not specifically illustrated, an interfacial film may be further formed along the profiles of the parts of the first active pattern AP1 that protrude beyond the field insulating films 115. The first gate insulating films 130 may be formed on the interfacial film.

The semiconductor device according to some example embodiments of the present disclosure may include negative capacitance field-effect transistors (NCFETs) using negative capacitors. For example, the first gate insulating films 130 may include ferroelectric material films having ferroelectric properties and paraelectric material films having paraelectric properties.

The ferroelectric material films may have negative capacitance, and the paraelectric material films may have positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material films having negative capacitance and the paraelectric material films having positive capacitance are connected in series, the total capacitance of the ferroelectric material films and the paraelectric material films may increase. Accordingly, transistors having the ferroelectric material films can have a sub-threshold swing (SS) of less than about 60 mV/decade at room temperature.

The ferroelectric material films may have ferroelectric properties. The ferroelectric material films may include, for example, at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material films may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), Ge, scandium (Sc), strontium (Sr), and Sn. The type of dopant may vary depending on the type of material of the ferroelectric material films.

If the ferroelectric material films include hafnium oxide, the dopant of the ferroelectric material films may include, for example, at least one of Gd, Si, Zr, Al, and Y.

If the dopant of the ferroelectric material films is Al, the ferroelectric material films may include about 3 atomic % (at %) to about 8 at % of Al. The ratio of the dopant in the ferroelectric material films may refer to the ratio of the sum of the amounts of Hf and Al to the amount of Al in the ferroelectric material films.

If the dopant of the ferroelectric material films is Si, the ferroelectric material films may include about 2 at % to about 10 at % of Si. If the dopant of the ferroelectric material films is Y, the ferroelectric material films may include about 2 at % to about 10 at % of Y. If the dopant of the ferroelectric material films is Gd, the ferroelectric material films may include about 1 at % to about 7 at % of Gd. If the dopant of the ferroelectric material films is Zr, the ferroelectric material films may include about 50 at % to about 80 at % of Zr.

The paraelectric material films may include paraelectric properties. The paraelectric material films may include, for example, at least one of silicon oxide and a high-k metal oxide. The high-k metal oxide may include, for example, at least one of hafnium oxide, zirconium oxide, and aluminum oxide, but the present disclosure is not limited thereto.

The ferroelectric material films and the paraelectric material films may include the same material. The ferroelectric material films may have ferroelectric properties, but the paraelectric material films may not have ferroelectric properties. For example, if the ferroelectric material films and the paraelectric material films include hafnium oxide, the hafnium oxide included in the ferroelectric material films may have a different crystalline structure from the hafnium oxide included in the paraelectric material films.

The ferroelectric material films may be thick enough to exhibit ferroelectric properties. The ferroelectric material films may have a thickness of, for example, about 0.5 nm to about 10 nm, but the present disclosure is not limited thereto. A critical thickness that can exhibit ferroelectric properties may vary depending on the type of ferroelectric material, and thus, the thickness of the ferroelectric material films may vary depending on the type of ferroelectric material included in the ferroelectric material films.

For example, the first gate insulating films 130 may include one ferroelectric material film. In another example, the first gate insulating films 130 may include a plurality of ferroelectric material films that are spaced apart from one another. The first gate insulating films 130 may have a structure in which a plurality of ferroelectric material films and a plurality of paraelectric material films are alternately stacked.

The first gate capping patterns 145 may be disposed on the top surface 120US of the first gate electrode 120 and the top surfaces of the first gate spacers 140.

Alternatively, each of the first gate capping patterns 145 may be disposed between the first gate spacers 140. In this case, top surfaces 145_US of the first gate capping patterns 145 may be disposed on the same plane as the top surfaces of the first gate spacers 140. The top surfaces 145_US of the first gate capping patterns 145 may correspond to the top surface of the gate structure GS.

The first source/drain regions 150 may be formed on the first active pattern AP1. The first source/drain regions 150 may be positioned above the substrate 100. The first source/drain regions 150 may be disposed on the side surfaces the gate structures GS. The first source/drain regions 150 may be disposed between the gate structures GS.

For example, the first source/drain regions 150 may be disposed on both sides of each of the gate structures GS. In another example, the first source/drain regions 150 may be disposed on one side, but not on the other side, of each of the gate structures GS.

The first source/drain regions 150 may include epitaxial patterns. The first source/drain regions 150 may be included in the sources/drains of transistors using the first active pattern AP1 as channel regions.

The first source/drain regions 150 may include first parts P1 and second parts P2.

The second parts P2 may include areas where the first source/drain contact 170 is disposed. Specifically, the second parts P2 may surround the areas on the first source/drain regions 150 where the first source/drain contact 170 is formed.

The second parts P2 may include areas that are doped with impurities to reduce the resistance between the first source/drain regions 150 and the first source/drain contact 170. In some example embodiments, the second parts P2 may include doped B.

The first parts P1 may be formed below the second parts P2. Specifically, the first parts P1 may surround the second parts P2.

The first parts P1 may prevent or reduce the impurities doped into the second parts P2 from diffusing beyond the first source/drain regions 150 and may include areas where ions are implanted to amorphize the first source/drain regions 150.

The first parts P1 may be formed by PAI. The first parts P1 may include amorphization ions for reducing the channeling of the impurities doped into the second parts P2.

In some example embodiments, the first parts P1 may include areas where CO ions are implanted. CO ions implanted into the second parts P2 may include amorphization ions for preventing or reducing the impurities doped into the second parts P2 from diffusing into, for example, the first active pattern AP1, beyond the first source/drain regions 150.

The first source/drain regions 150 may be connected to channel pattern parts of the first active pattern AP1 that are used as channels.

Lower etching stopper films 156 may be disposed on the top surfaces of the field insulating films 115, the sidewalls of the gate structures GS, and the top surfaces and the sidewalls of the first source/drain regions 150. The lower etching stopper films 156 may include a material having etching selectivity with respect to a first interlayer insulating film 190 that will be described later. The lower etching stopper films 156 may include at least one of, for example, SiN, SiON, SiOCN, SiBN, SiOBN, SiOC, and a combination thereof. Alternatively, the lower etching stopper films 156 may not be provided.

The first interlayer insulating film 190 may be formed on the field insulating films 115. The first interlayer insulating film 190 may be disposed on the first source/drain regions 150. The first interlayer insulating film 190 may not cover the top surfaces of the first gate capping patterns 145. For example, the top surface of the first interlayer insulating film 190 may be disposed on the same plane as the top surfaces 145_US of the first gate capping patterns 145.

The first gate contact 180 may be disposed in the gate structures GS. The first gate contact 180 may be connected to a first gate electrode 120 included in one of the gate structures GS. The first gate contact 180 may be disposed to overlap with one of the gate structures GS.

The first source/drain contact 170 may be connected to the first source/drain regions 150 through the lower etching stopper films 156. The first source/drain contact 170 may be disposed on the first source/drain regions 150.

The first source/drain contact 170 may be disposed in the first interlayer insulating film 190. The first source/drain contact 170 may be surrounded by the first interlayer insulating film 190.

The first source/drain contact 170 is illustrated as not being in contact with the gate structures GS on both sides thereof, but the present disclosure is not limited thereto. Alternatively, the first source/drain contact 170 may be in contact with at least one of the gate structures GS on both sides thereof.

Silicide films 155 may be formed between the first source/drain contact 170 and the first source/drain regions 150. The silicide films 155 may be formed along the profiles of the interfaces between the first source/drain contact 170 and the first source/drain regions 150, but the present disclosure is not limited thereto. The silicide films 155 may include, for example, a metal silicide material.

The first source/drain contact 170 may include first and second contact portions. The first contact portions may be directly connected to the second contact portions.

The second contact portion of the first source/drain contact 170 may be part of the first source/drain contact 170 where the first via plug 206 is landed. The first source/drain contact 170 may be connected to the wiring lines 205 through the second contact portion of the first source/drain contact 170. The first contact portion of the first source/drain contact 170 may not be the part of the first source/drain contacts 170 where the first via plug 206 is landed.

For example, as illustrated in FIG. 15, the second contact portion of the first source/drain contact 170 may be disposed at a location that is not connected to the first via plug 206. The first contact portion of the first source/drain contact 170 may be disposed at a location that is connected to the first via plug 206.

To prevent or reduce the occurrence of the first gate contact 180 from being in contact with the first source/drain contact 170, the first contact portion of the first source/drain contact 170, but not the second contact portion of the first source/drain contact 170, may be positioned on both sides of a gate structure GS connected to the first gate contact 180, as illustrated in FIG. 15.

The top surface of the second contact portion of the first source/drain contacts 170 may be higher than the top surface of the first contact portion of the first source/drain contact 170. The top surface of the second contact portion of the first source/drain contact 170 may be higher than the top surface of the first contact portion of the first source/drain contact 170 with respect to the top surfaces of the field insulating films 115. For example, the top surface of the first source/drain contact 170 may correspond to the top surface of the second contact portion of the first source/drain contact 170.

The first interlayer insulating film 190 may not cover the top surface of the first source/drain contact 170. For example, the first interlayer insulating film 190 may not cover the top surface of the second contact portion of the first source/drain contact 170. The top surface of the first source/drain contact 170 may correspond to the top surface of the second contact portion of the first source/drain contact 170.

For example, the top surface of the first source/drain contact 170 may not protrude beyond the top surfaces 145_US of the first gate capping patterns 145. The top surface of the second contact portion of the first source/drain contact 170 may be disposed on the same plane as the top surfaces 145_US of the gate structures GS. Alternatively, the top surface of the first source/drain contact 170 may protrude beyond the top surfaces 145_US of the first gate capping patterns 145.

The first source/drain contact 170 may include first source/drain barrier films 170a and first source/drain filling films 170b, which are on the first source/drain barrier films 170a. The first source/drain barrier films 170a may extend along the sidewalls and the bottom surface of each of the first source/drain filling films 170b.

The first source/drain barrier films 170a may include at least one of, for example, Ta, TaN, Ti, TiN, TiSiN, Ru, Co, Ni, nickel-boron (NiB), W, WN, tungsten carbonitride (WCN), Zr, zirconium nitride (ZrN), V, vanadium nitride (VN), Nb, NbN, Pt, Ir, Rh, and a two-dimensional (2D) material. The 2D material may be a metallic material and/or a semiconductor material. The 2D material may include a 2D allotrope or a 2D compound such as, for example, graphene, molybdenum Disulfide ($MoS_2$), molybdenum diselenide ($MoSe_2$), tungsten diselenide ($WSe_2$), or tungsten disulfide ($WS_2$), but the present disclosure is not limited thereto. The type of the 2D material is not particularly limited.

The first source/drain filling films 170b may include at least one of, for example, Al, W, Co, Ru, Ag, Au, manganese (Mn), and Mo.

The first gate contact 180 may be disposed on a first gate electrode 120. The first gate contact 180 may be connected to the first gate electrode 120 through a first gate capping pattern 145.

For example, the top surface of the first gate contact 180 may be disposed on the same plane as the top surfaces 145_US of the first gate capping patterns 145. In another example, the top surface of the first gate contact 180 may protrude beyond the top surfaces 145_US of the first gate capping patterns 145.

The first gate contact 180 may include a gate barrier film 180a, a gate filling film 180b, which is on the gate barrier film 180a. The materials of the gate barrier film 180a and the gate filling film 180b may be the same as the materials of the first source/drain barrier films 170a and the first source/drain filling films 170b.

A second interlayer insulating film 191 may be disposed on the first interlayer insulating film 190 and the gate structures GS. The second interlayer insulating film 191 may include first and second via holes 206t and 207t. The first via hole 206t may expose the first source/drain contact 170. The second via hole 207t may expose the first gate contact 180.

An upper etching stopper film 196 may be disposed between the first and second interlayer insulating films 190 and 191. The upper etching stopper film 196 may be disposed on the first gate capping patterns 145, the first gate contact 180, and the first source/drain contact 170.

The upper etching stopper film 196 may include a material having etching selectivity with respect to the second interlayer insulating film 191. The upper etching stopper film 196 may include at least one of, for example, SiN, SiON, SiOCN, SiBN, SiOBN, SiOC, aluminum oxide (AlO), aluminum nitride (AlN), aluminum oxycarbide (AlOC), and a combination thereof. Alternatively, the upper etching stopper film 196 may not be provided.

The first and second via plugs 206 and 207 may be disposed in the second interlayer insulating film 191. The first via plug 206 may be connected to the first source/drain contact 170 through the upper etching stopper film 196. The second via plug 207 may be connected to the first gate contact 180 through the upper etching stopper film 196. Although not specifically illustrated, the first via plug 206 may be connected to a second source/drain contact 270.

The first via plug 206 may fill the first via hole 206t in the second interlayer insulating film 191 and the upper etching stopper film 196. Part of the first via plug 206 may protrude beyond a top surface 191_US of the second interlayer insulating film 191.

The first via plug 206 may include a lower portion 206LP and an upper portion 206UP. The upper portion 206UP may be part of the first via plug 206 that protrudes beyond the top surface 191_US of the second interlayer insulating film 191 in the fourth direction D4.

The bottom surface of the first via plug 206 may be lower than the top surfaces 145_US of the first gate capping patterns 145. For example, during the formation of the first via hole 206t, part of the first source/drain contact 170 may be etched. As a result, part of the first via plug 206 may be recessed into the first source/drain contact 170. Alternatively, the top surface of the first source/drain contact 170 may be generally lowered below the top surfaces 145_US of the first gate capping patterns 145 by partially etching the first source/drain contact 170 before the formation of the upper etching stopper film 196.

The first via plug 206 may have a single-film structure. The first via plug 206 may be formed as a single film. That is, the first via plug 206 may be formed as a single conductive film.

The first via plug 206 may include, for example, W. The first via plug 206 may be formed as a single film including W.

The second via plug 207 may fill the second via hole 207t in the second interlayer insulating film 191 and the upper etching stopper film 196. Part of the second via plug 207 may protrude beyond the top surface 191_US of the second interlayer insulating film 191.

The second via plug 207 may include a second barrier conductive film 207a and a second plug conductive film 207b. The second barrier conductive film 207a may extend along the sidewalls and the bottom of the second via hole 207t. The second barrier conductive film 207a may extend along the sidewalls and the bottom surface of the second plug conductive film 207b.

The second via plug 207 may have a multi-film structure. That is, the second via plug 207 may have a multilayer conductive film structure.

The bottom surface of the second via plug 207 may be lower than the top surfaces 145_US of the first gate capping patterns 145.

The second barrier conductive film 207a may include at least one of, Ta, TaN, Ti, TiN, TiSiN, Ni, NiB, WN, WCN, Zr, ZrN, V, VN, Nb, NbN, Pt, Ir, Rh, and a 2D material.

The second plug conductive film 207b may include at least one of, for example, Al, W, Co, Ru, Cu, Ag, Au, Mn, and Mo. The second plug conductive film 207b may include the same material as the first via plug 206. The second plug conductive film 207b may include W.

An etching stopper structure film 210 is disposed on the second interlayer insulating film 191. The etching stopper structure film 210 may include a plurality of films that are sequentially stacked on the second interlayer insulating film 191.

The etching stopper structure film 210 may include first, second, and third etching stopper films 211, 212, and 213, which are sequentially stacked on the second interlayer insulating film 191. The first and third etching stopper films 211 and 213 may include the same material. The first and third etching stopper films 211 and 213 may include a metal oxide such as, for example, aluminum oxide. The second etching stopper film 212 may include, for example, SiOC.

The etching stopper structure film 210 may be in contact with the top surface 191_US of the second interlayer insulating film 191. The first etching stopper film 211 may be in contact with the top surface 191_US of the second interlayer insulating film 191.

A third interlayer insulating film 192 is disposed on the etching stopper structure film 210. The third interlayer insulating film 192 may be in contact with the etching stopper structure film 210. The third etching stopper film 212 may be in contact with the third interlayer insulating film 192. The third interlayer insulating film 192 may include at least one of, for example, silicon oxide, silicon nitride, silicon oxynitride, and a low-k material.

The wiring lines 205 may be disposed in the third interlayer insulating film 192. The wiring lines 205 may be connected to the first via plug 206. The wiring lines 205 may be in contact with the first via plug 206. The wiring lines 205 may be connected to the second via plug 207. The wiring lines 205 may be in contact with the second via plug 207.

The first, second, and third etching stopper films 211, 212, and 213 are in contact with the sidewalls of each of the wiring lines 205, near the first and second via plugs 206 and 207.

The first, second, and third etching stopper films 211, 212, and 213 may not protrude in the fourth direction D4, at locations away from the first and second via plugs 206 and 207. That is, the first, second, and third etching stopper films 211, 212, and 213 may be flat, at locations away from the first and second via plugs 206 and 207.

The wiring lines 205 may include wiring barrier films 205a and wiring filling films 205b. The wiring barrier films 205a may extend along the top surface 191_US of the second interlayer insulating film 191, a top surface 206_US of the first via plug 206, and a top surface 207_US of the second via plug 207. The wiring filling films 205b may be disposed on the wiring barrier films 205a.

The wiring barrier films 205a may include at least one of, for example, Ta, TaN, Ti, TiN, TiSiN, Ru, Co, Ni, NiB, W, WN, WCN, Zr, ZrN, V, VN, Nb, NbN, Pt, Ir, Rh, and a 2D material. The wiring filling films 205b may include at least one of, Al, Cu, W, Co, Ru, Ag, Au, Mn, and Mo.

Although not specifically illustrated, a first connecting contact, which connects the first via plug 206 and the first source/drain contact 170, may be further disposed between the first via plug 206 and the first source/drain contact 170, and a second connecting contact, which connects the second via plug 207 and the first gate contact 180, may be further disposed between the second via plug 207 and the first gate contact 180.

Referring to FIGS. 14, 17, and 18, the first active pattern AP1 may include a lower pattern BP1 and sheet patterns UP1. For convenience, the example embodiments of FIGS. 17 and 18 will hereinafter be described, focusing mainly on the differences with the example embodiments of FIGS. 14 through 16.

The lower pattern BP1 may extend in the fifth direction D5. The sheet patterns UP1 may be disposed above the lower pattern BP1 to be spaced apart from the lower pattern BP1.

The first active pattern AP1 may include a plurality of sheet patterns UP1, which are stacked in the fourth direction D4. FIGS. 17 and 18 illustrate that the first active pattern AP1 includes three sheet patterns UP1, but the present disclosure is not limited thereto.

The sheet patterns UP1 may be connected to the first source/drain regions 150. The sheet patterns UP1 may be channel patterns for use as the channel regions of transistors. For example, the sheet patterns UP1 may be nanosheets or nanowires.

The first gate insulating films 130 may extend along the top surface of the lower pattern BP1 and the top surfaces of the field insulating films 115. The first gate insulating films 130 may surround the sheet patterns UP1.

The first gate electrodes 120 may be disposed on the lower pattern BP1. The first gate electrodes 120 may intersect the lower pattern BP1. The first gate electrodes 120 may surround the sheet patterns UP1. The first gate electrodes 120 may be disposed between the lower pattern BP1 and the sheet patterns UP1 and between the sheet patterns UP1.

The first gate spacers 140 may include only outer spacers 141. No inner spacers may be provided between the lower pattern Bp1 and the sheet patterns UP1 and between the sheet patterns UP1.

The bottom surface of the first source/drain contact 170 may be positioned between the top surface of the lowermost sheet pattern UP1 and the bottom surface of the uppermost sheet pattern UP1. Alternatively, the bottom surface of the first source/drain contact 170 may be positioned between the top surface and the bottom surface of the uppermost sheet pattern UP1.

FIGS. 19 through 22 are cross-sectional views illustrating a method of fabricating a semiconductor device according to some example embodiments of the present disclosure.

Figure 19:
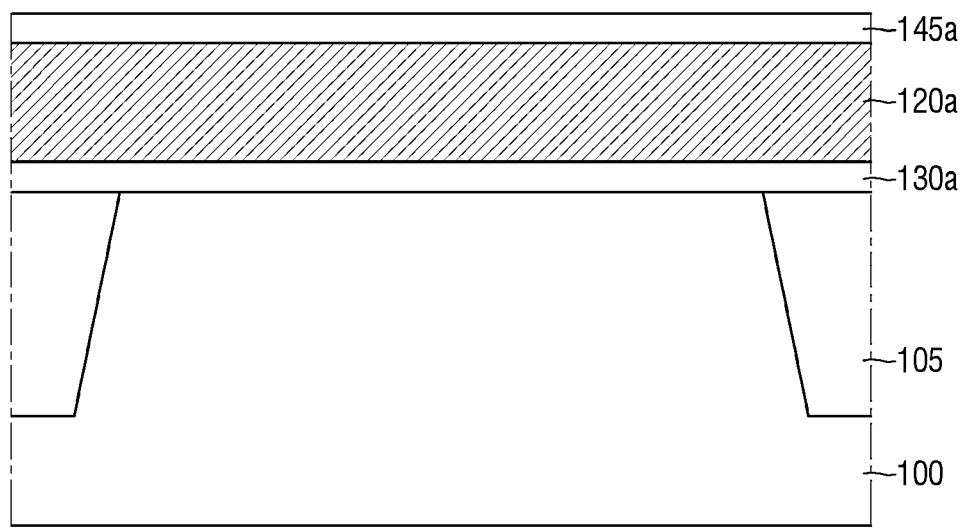
FIGS. 19 through 22 are cross-sectional views illustrating a method of fabricating a semiconductor device according to some example embodiments of the present disclosure.

Referring to FIG. 19, a gate insulating film 130a, a gate electrode film 120a, and a gate capping pattern film 145a may be sequentially formed on a substrate 100.

First device isolation films 105, which define an active region, are formed. The first device isolation films 105 may be formed in an STI structure.

Figure 20:
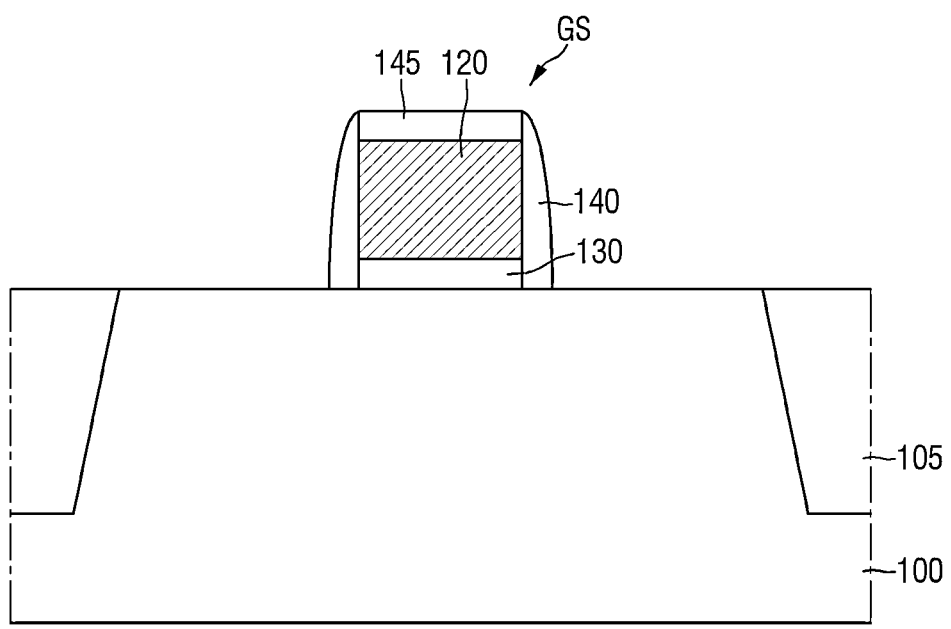

Referring to FIG. 20, a gate structure GS, which includes a gate insulating film 130, a gate electrode 120, gate spacers 140, and a gate capping pattern 145, may be formed by patterning the gate insulating film 130a, the gate electrode film 120a, and the gate capping pattern film 145a.

Specifically, the gate insulating film 130, the gate electrode 120, and the gate capping pattern 145 may be formed by patterning the gate insulating film 130a, the gate electrode film 120a, and the gate capping pattern film 145a.

Although not specifically illustrated, a gate spacer film may be conformally formed along the top surface of the substrate 100, the side surfaces of the gate electrode 120, and the top surface and the side surfaces of the gate capping pattern 145. The gate spacers 140 may be formed on the side surfaces of each of the gate insulating film 130, the gate electrode 120, and the gate capping pattern 145 by removing the gate spacer film from the top surfaces of the substrate 100 and the gate capping pattern 145.

Figure 21:
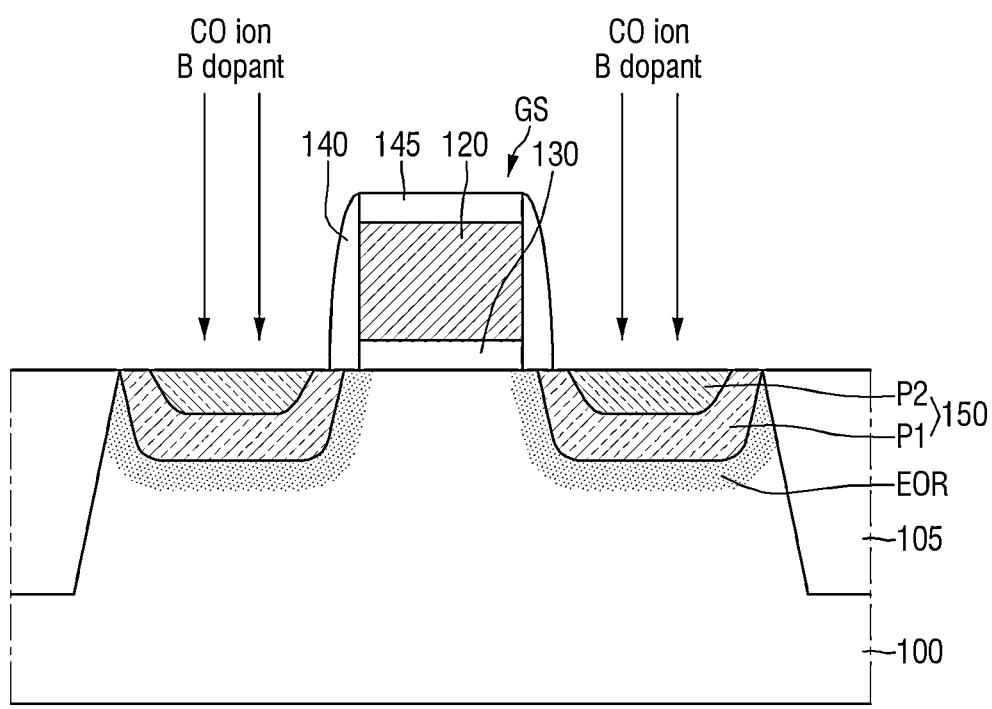

Referring to FIG. 21, first source/drain regions 150 may be formed by implanting or doping CO ions and B into the substrate 100. As a result, EOR regions "EOR" may be formed below the first source/drain regions 150.

As a result of the implantation of CO ions, first parts P1 of the first source/drain regions 150 may be formed. As a result of the implantation of B, second parts P2 of the first source/drain regions 150 may be formed. The second parts P2 may be formed on the first parts P1.

In some example embodiments, the first parts P1 and the second parts P2 may be formed by implanting CO ions and then B into the substrate 100. In some example embodiments, the first parts P1 and the second parts P2 may be formed by implanting B and then CO ions into the substrate 100.

The first source/drain regions 150 may be recrystallized by performing thermal treatment after the implantation of CO ions and B.

Figure 22:
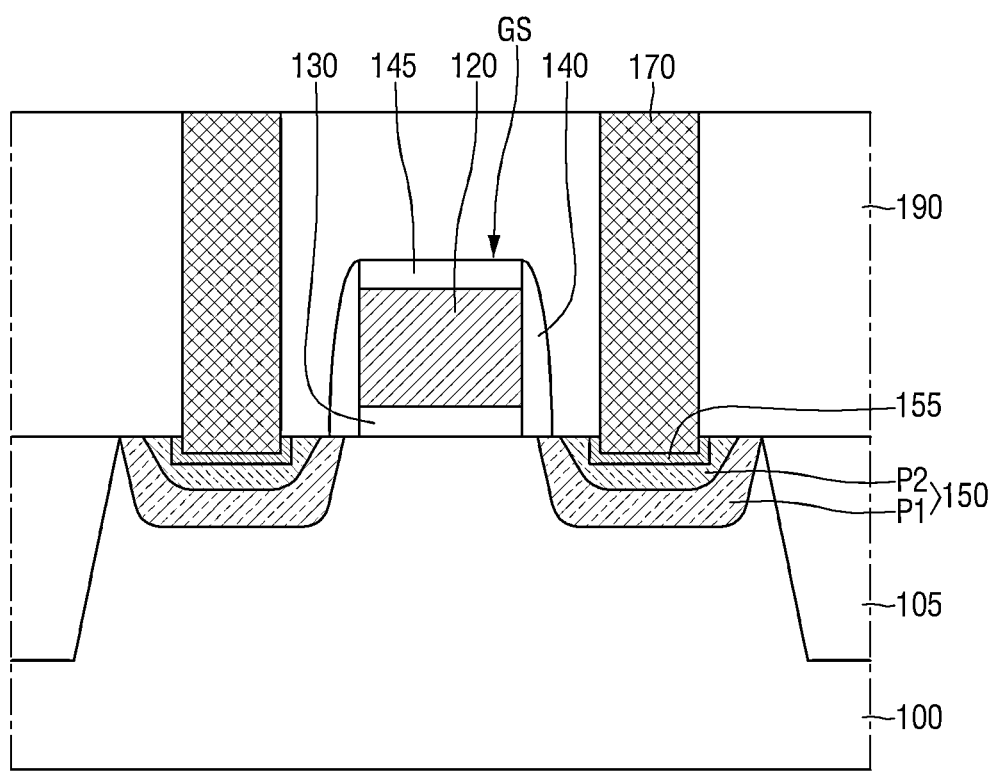

Referring to FIG. 22, first source/drain contacts 170 may be formed on the first source/drain regions 150. The first source/drain contacts 170 may be formed on the second parts P2 of the first source/drain regions 150.

Specifically, a first interlayer insulating film 190 may be formed on the substrate 100, the first source/drain regions 150, and the gate structure GS, and the first source/drain contacts 170 may be formed in the first interlayer insulating film 190.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In concluding the detailed description, those skilled in the art will appreciate that many variations and modifications may be made to the example embodiments without substantially departing from the principles of the present inventions. Therefore, the disclosed example embodiments of the inventions are used in a generic and descriptive sense only and not for purposes of limitation.

What is claimed is:

1. A semiconductor device comprising:
   a substrate;
   device isolation films defining an active region in the substrate;
   a gate pattern in the active region; and
   source/drain regions on both sides of the gate pattern, in the active region,
   wherein the source/drain regions include first parts, which comprise carbon monoxide (CO) ions, and
   wherein the source/drain regions further include second parts on top of the first parts, and the second parts are doped with a different material than CO.

2. The semiconductor device of claim 1, wherein the second parts are doped with boron (B).

3. The semiconductor device of claim 1, further comprising:
   contacts connected to the source/drain regions, on the substrate, wherein:
   the second parts include doped Boron (B), and
   ends of the contacts are surrounded by the second parts of the source/drain regions.

4. The semiconductor device of claim 3, further comprising:
   silicide films between the contacts and the second parts of the source/drain regions.

5. The semiconductor device of claim 1, further comprising:
   end-of-range (EOR) regions including defects, below the source/drain regions,
   wherein a thickness of the source/drain regions is greater than a thickness of the EOR regions.

6. The semiconductor device of claim 1, wherein the source/drain regions include silicon-germanium (SiGe).

7. The semiconductor device of claim 1, wherein a dose of the CO ions doped into the first parts is $1E^{14}/cm^2$.

8. A semiconductor device comprising:
   a substrate including a cell region and a peripheral region, which is defined around the cell region;

a bitline structure including a cell conductive line and a cell line capping film, which is on the cell conductive line, on the substrate;

a cell gate electrode in the substrate in the cell region, the cell gate electrode intersecting the cell conductive line; and a peripheral gate pattern on an active region of the peripheral region; and source/drain regions on both sides of the gate pattern, in the active region of the peripheral region, wherein the source/drain regions include first parts, which comprise carbon monoxide (CO) ions, and wherein the source/drain regions further include second parts on top of the first parts, and the second parts are doped with a different material than CO.

9. The semiconductor device of claim 8, wherein the second parts are doped with boron (B).

10. The semiconductor device of claim 8, further comprising:

contacts connected to the source/drain regions, on the substrate, wherein:

the second parts include doped boron (B), and ends of the contacts are surrounded by the second parts of the source/drain regions.

11. The semiconductor device of claim 10, further comprising: silicide films between the contacts and the second parts of the source/drain regions.

12. The semiconductor device of claim 8, further comprising:

end-of-range (EOR) regions including defects, below the source/drain regions, wherein a thickness of the source/drain regions is greater than a thickness of the EOR regions.

13. The semiconductor device of claim 8, wherein the source/drain regions include silicon-germanium (SiGe).

14. The semiconductor device of claim 8, wherein a dose of the CO ions doped into the first parts is $1E^{14}/cm^2$.

15. A semiconductor device comprising:

an active pattern extending in a first direction on a substrate;

gate structures including gate electrodes, which extend in a second direction different from the first direction, on the active pattern; and source/drain regions between the gate electrodes, on top of the active pattern, wherein the source/drain regions include first parts, which comprise carbon monoxide (CO) ions.

16. The semiconductor device of claim 15, wherein the active pattern is a fin-type pattern.

17. The semiconductor device of claim 15, wherein the active pattern includes a lower pattern and sheet patterns, which are spaced apart from the lower pattern, and the gate electrodes surround the sheet patterns.

18. The semiconductor device of claim 15, wherein the source/drain regions further include second parts, which are doped with boron (B), and the second parts are on the first parts.

19. The semiconductor device of claim 15, further comprising:

contacts connected to the source/drain regions, on the substrate, wherein the source/drain regions further include second parts, which are positioned on the first parts and include doped boron (B), ends of the contacts are surrounded by the second parts of the source/drain regions.

20. The semiconductor device of claim 15, further comprising:

end-of-range (EOR) regions including defects, below the source/drain regions, wherein a thickness of the source/drain regions is greater than a thickness of the EOR regions.

* * * * *